(12) United States Patent
Nishihara et al.

(10) Patent No.: US 7,203,086 B2
(45) Date of Patent: Apr. 10, 2007

(54) DATA READING METHOD, DATA WRITING METHOD, AND SEMICONDUCTOR MEMORY DEVICE

(75) Inventors: Toshiyuki Nishihara, Kanagawa (JP); Yukihisa Tsuneda, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 11/386,843

(22) Filed: Mar. 23, 2006

(65) Prior Publication Data

US 2006/0164878 A1  Jul. 27, 2006

Related U.S. Application Data

(62) Division of application No. 10/798,413, filed on Mar. 12, 2004, now Pat. No. 7,142,444.

(30) Foreign Application Priority Data

Mar. 27, 2003  (JP) ............... P2003-087687
Jul. 28, 2003  (JP) ............... P2003-280608

(51) Int. Cl.
*G11C 11/22* (2006.01)
*G11C 7/12* (2006.01)
*G11C 7/22* (2006.01)

(52) U.S. Cl. ............. 365/145; 365/203; 365/204
(58) Field of Classification Search ........... 365/145, 365/149, 203, 204, 51, 230.05, 63, 65
See application file for complete search history.

(56) References Cited

U.S. PATENT DOCUMENTS 4,873,664 A  10/1989 Eaton, Jr.

(Continued)

FOREIGN PATENT DOCUMENTS

JP  09-116107  5/1997

(Continued)

OTHER PUBLICATIONS

2001 Symposium on VLSI Circuit Digest of Technical Papers, "A Bit-Line GND Sense Technique for Low-Voltage Operation FeRAM", Kawashima, et al.

(Continued)

*Primary Examiner*—Jung (John) H. Hur
(74) *Attorney, Agent, or Firm*—Rader Fishman & Grauer PLLC; Ronald P. Kananen

(57) ABSTRACT

In a data reading method, a first reading pulse is applied to a memory cell to generate a first signal corresponding to data stored in the memory cell, reference signal generating data corresponding to a high level side is written to the memory cell, a second reading pulse is applied to the memory cell to generate a second signal corresponding to the reference signal generating data, and a reference signal is generated on the basis of the second signal. Then the first signal and the reference signal are compared with each other to determine the stored data stored in the memory cell. In data writing, high-level data is written to the memory cell without using a bit line.

4 Claims, 19 Drawing Sheets

U.S. PATENT DOCUMENTS

| | | | | |
|---|---|---|---|---|
| 5,373,463 | A | * | 12/1994 | Jones Jr. .................... 365/145 |
| 5,753,946 | A | * | 5/1998 | Naiki et al. ................. 257/295 |
| 6,301,145 | B1 | * | 10/2001 | Nishihara ................... 365/145 |
| 6,449,184 | B2 | * | 9/2002 | Kato et al. .................. 365/145 |
| 6,459,110 | B1 | * | 10/2002 | Tani ........................... 257/295 |
| 6,510,073 | B1 | * | 1/2003 | Lee et al. ................... 365/145 |
| 6,566,698 | B2 | * | 5/2003 | Nishihara et al. ........... 257/295 |
| 6,724,645 | B1 | * | 4/2004 | Lanham et al. ............. 365/145 |
| 2002/0079520 | A1 | * | 6/2002 | Nishihara et al. ........... 257/245 |
| 2003/0214831 | A1 | * | 11/2003 | Kang ......................... 365/145 |

FOREIGN PATENT DOCUMENTS

JP  2002-197857  7/2002

OTHER PUBLICATIONS

ISSCC 2003 Session 16, "A 512Kb Cross-Point Cell MRAM" Sakimura, et al.

* cited by examiner

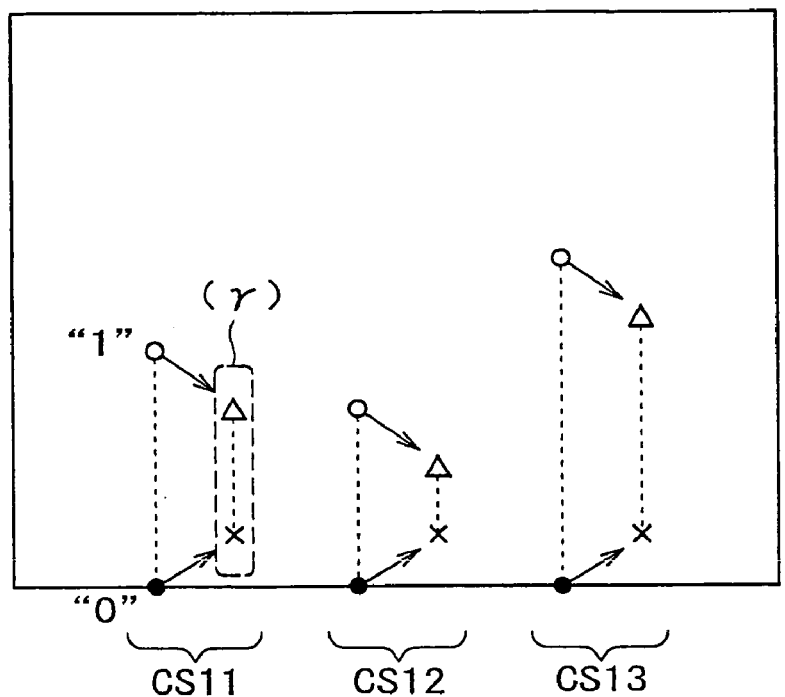
F I G. 1 A
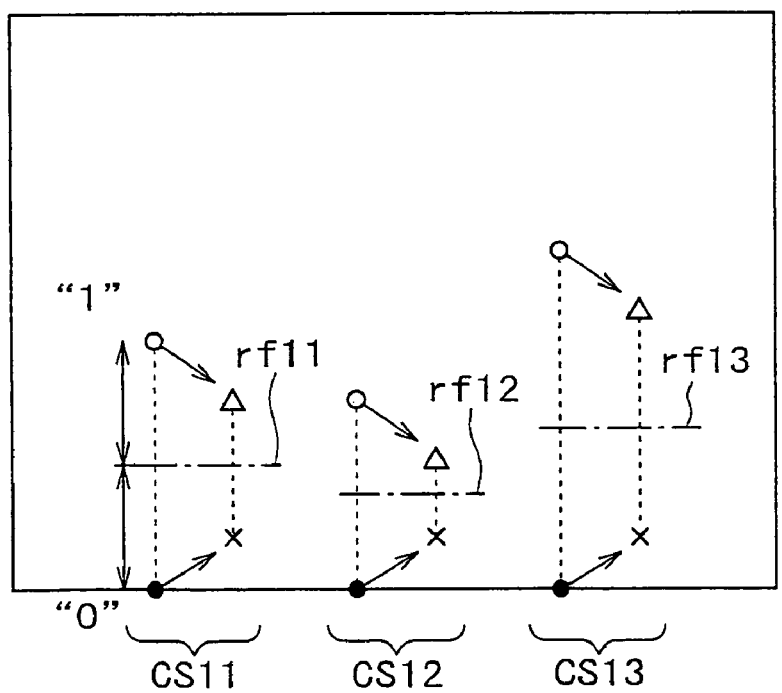
F I G. 1 B

F I G. 4
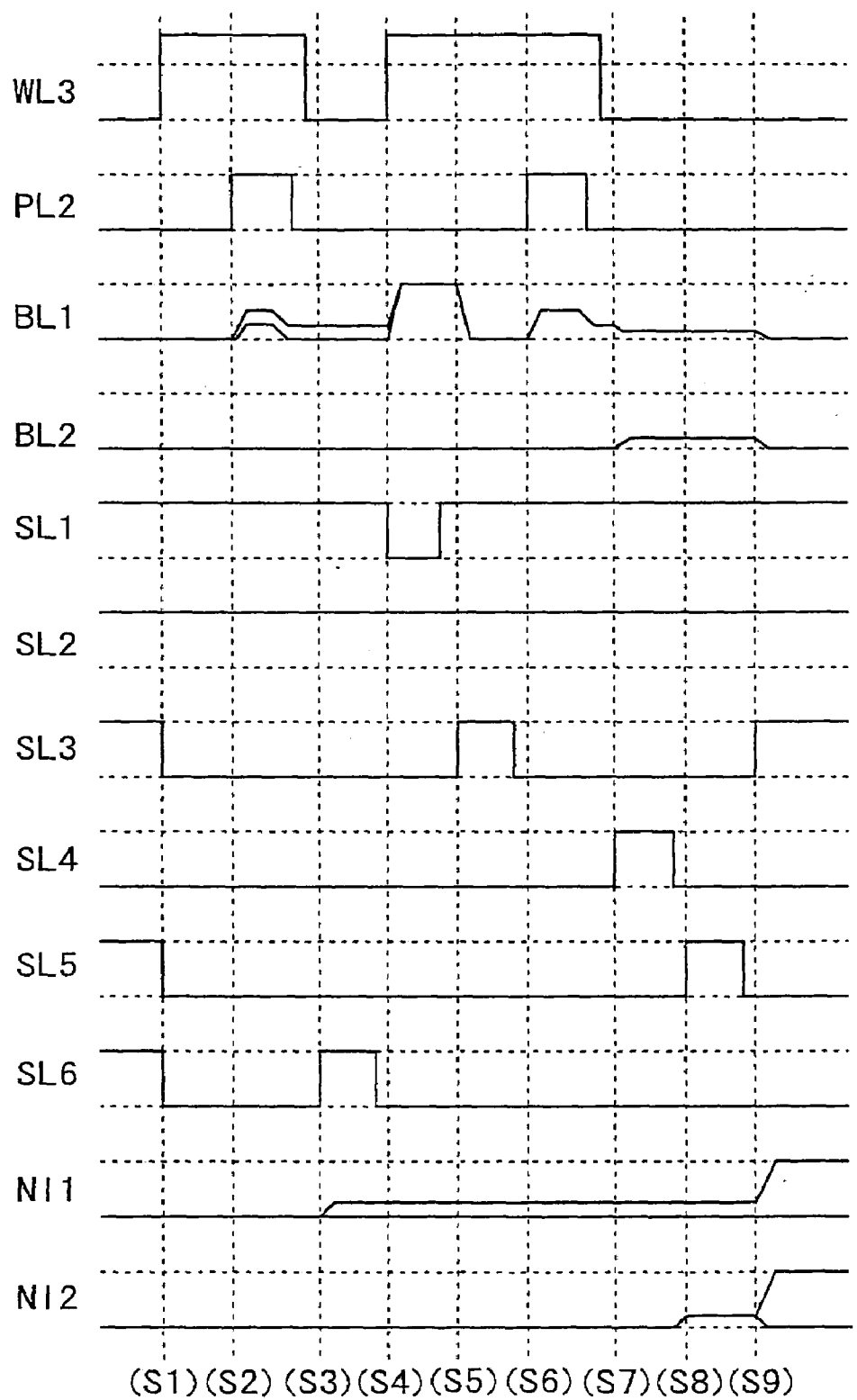

F I G. 1 2
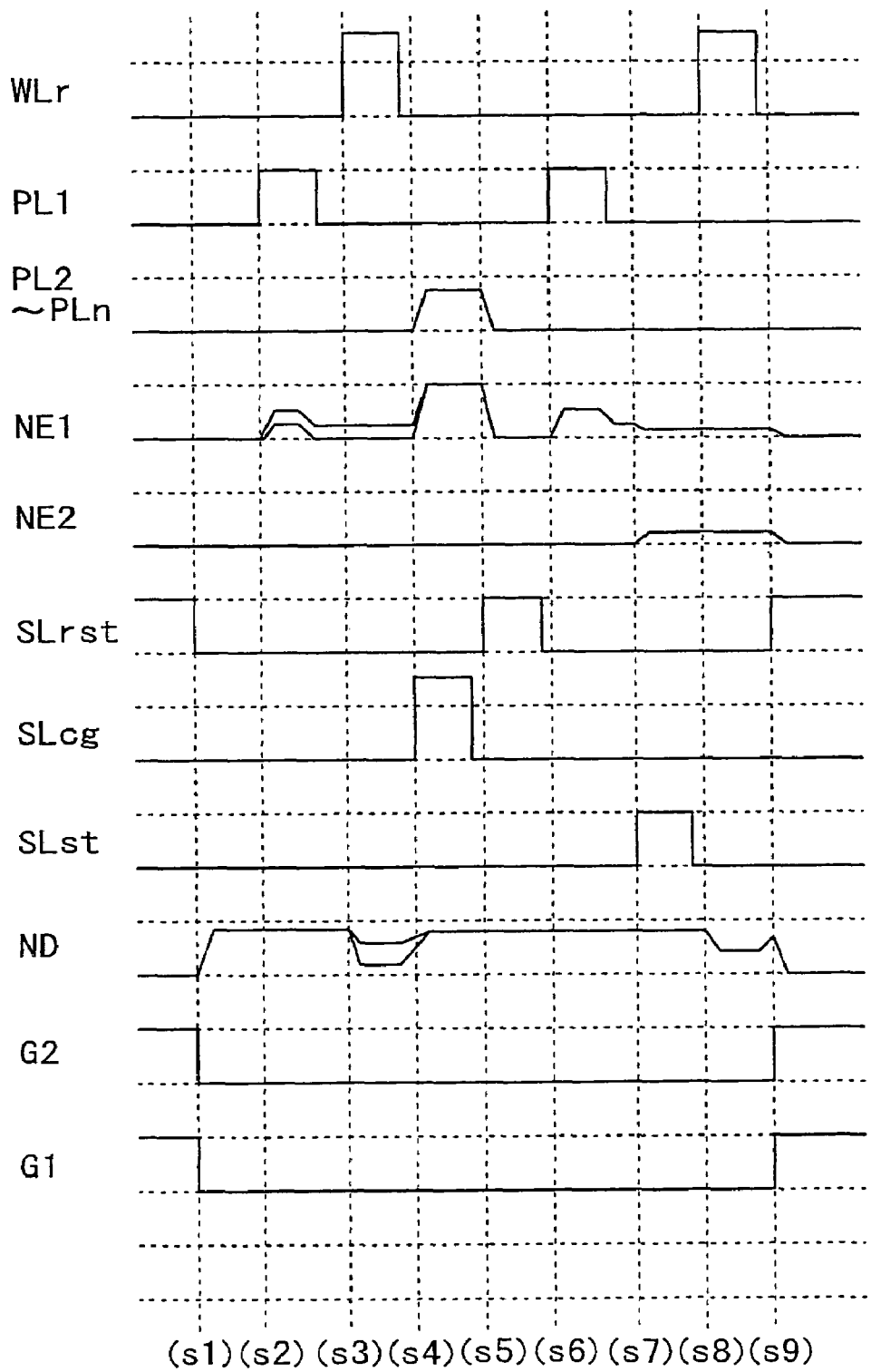

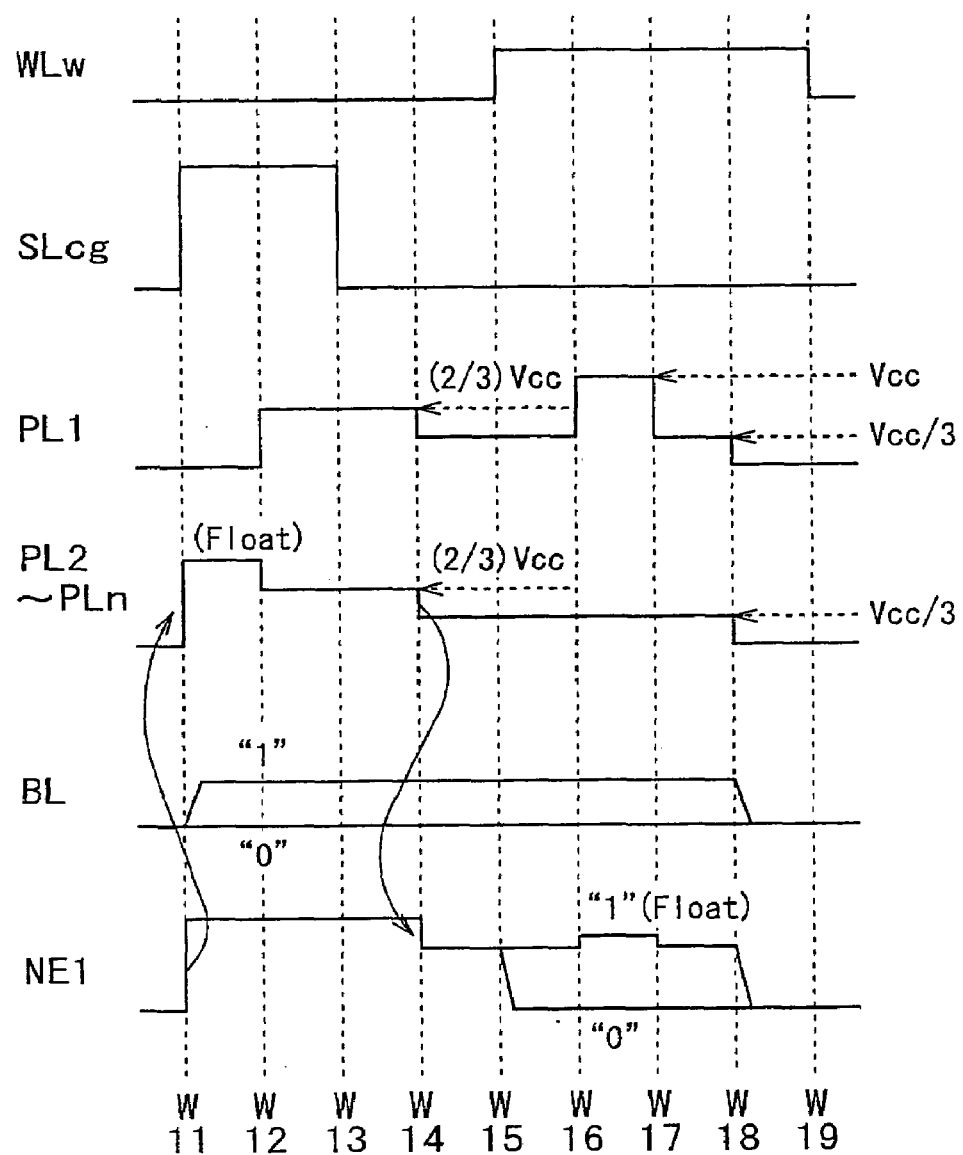

FIG. 15A
FIRST READING
FIG. 15B
SECOND READING
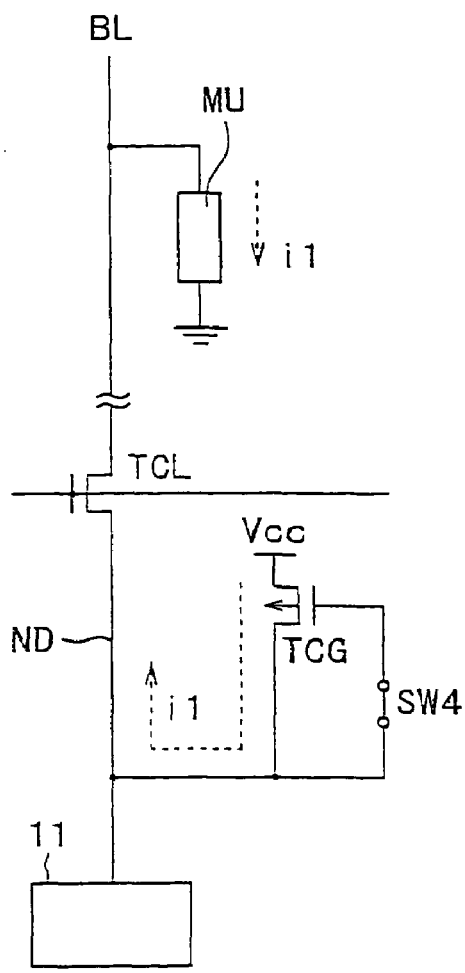
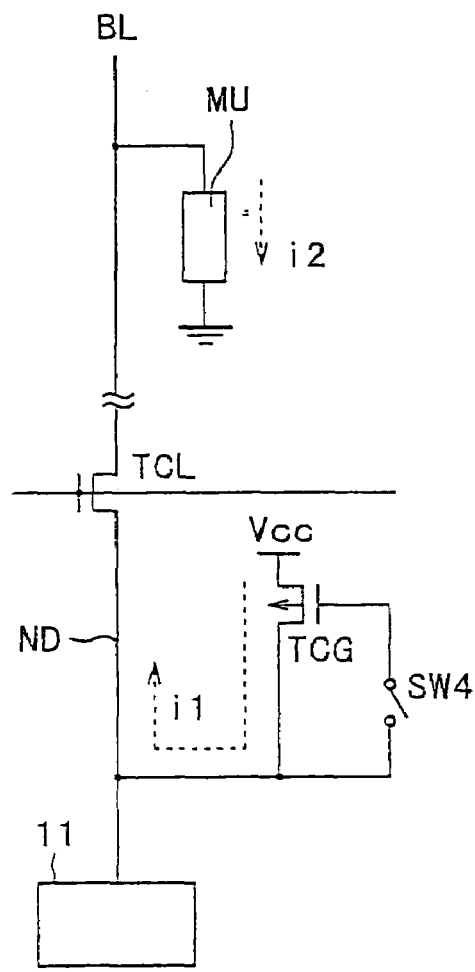

F I G. 1 8 PRIOR ART

DATA READING METHOD, DATA WRITING METHOD, AND SEMICONDUCTOR MEMORY DEVICE

This application is a divisional of application Ser. No. 10/798,413, filed on Mar. 12, 2004, now U.S. Pat. No. 7,142,444, issued on Nov. 28, 2006, the entire contents of which are incorporated by reference.

BACKGROUND OF THE INVENTION

The present invention relates to a data reading method and a data writing method in a semiconductor memory device such as a ferroelectric memory, for example, and a semiconductor memory device for carrying out the data reading method or the data writing method.

[Patent Literature 1] U.S. Pat. No. 4,873,664
[Patent Literature 2] Japanese Patent Laid-Open No. 2002-197857
[Patent Literature 3] Japanese Patent Laid-Open No. Hei 9-116107

Various semiconductor memories using new memory materials have recently been proposed. Many of these memories are nonvolatile but capable of high speed operation equal to a DRAM, and thus promise to be applied in the future as "next-generation memories." A typical example of such memories is a ferroelectric memory. A cell structure and operation of a currently mainstream ferroelectric memory are disclosed in Patent Literature 1.

FIG. 16 represents an example of a method of realizing the ferroelectric memory.

In a structure shown in FIG. 16, a memory cell is formed by one access transistor Ta and one ferroelectric capacitor C. The memory cell stores two values, that is, 1 bit according to a direction of polarization of the ferroelectric capacitor C.

A word line decoder/driver 1 applies a voltage to word lines WL (WL1, WL2 . . . ) according to an address to be accessed. A predetermined word line WL applies a voltage to a gate electrode of the access transistor Ta in each memory cell. Therefore the memory cell is selected by driving the word line WL.

Bit lines BL (BL1, BL2 . . . ) are arranged in a direction orthogonal to the word lines WL.

The bit lines BL1 and BL2 form a bit line pair whose potential is detected by a sense amplifier 3-1. The bit lines BL3 and BL4 form a bit line pair whose potential is detected by a sense amplifier 3-2.

In each memory cell, the access transistor Ta is turned on by the word line WL, whereby the memory cell is connected to the corresponding bit line BL.

A plate line decoder/driver 2 applies a predetermined voltage to plate lines PL (PL1, PL2 . . . ).

A predetermined plate line PL is connected with one terminal of the capacitor C of each memory cell.

A data reading operation will be described with reference to a hysteresis curve of FIG. 17 by taking as an example data reading from a memory cell formed by a capacitor C(*) and an access transistor Ta(*) provided with (*) in FIG. 16 in such a configuration.

In reading data from the capacitor C(*), the word line WL3 is selected, and a pulse is applied to the plate line PL2. Then, since the access transistor Ta(*) of the memory cell is turned on, a signal read from the ferroelectric capacitor C(*) appears in the bit line BL1 connected to an opposite electrode of the ferroelectric capacitor C(*).

This state will be described with reference to FIG. 17. An axis of abscissas indicates voltage applied to the ferroelectric capacitor, and an axis of ordinates indicates amount of polarization.

In an initial state of reading, the plate line PL2 and the bit line BL1 are equalized to 0V, and the bit line BL1 is in a floating state.

The ferroelectric capacitor C(*) is polarized in a different direction according to data stored therein. For example, the capacitor with data of "0" is in an (H0) state, and the capacitor with data of "1" is in an (H1) state in FIG. 17.

A pulse of a voltage Vcc is applied to the plate line PL2, whereby substantially Vcc is applied to the capacitor C(*). Then, the amount of polarization is shifted to an (H2) state in both of the above cases. Accordingly a signal difference corresponding to a difference in amount of polarization change from the initial state appears as a signal difference in reading of "0" and "1" in the bit line BL1.

That is, only in a case where "1" data is stored in the "H1" state, the ferroelectric capacitor C(*) effects polarization inversion, and a signal difference corresponding to the inversion appears in the bit line BL1. Specifically, a potential of the bit line BL1 at the time of reading of the "1" data involving the polarization inversion is higher than that at the time of reading of the "0" data not involving the polarization inversion.

By for example supplying an intermediate potential between a read signal when the "1" data is stored and a read signal when the "0" data is stored as a reference signal to the bit line BL2 forming a pair, and comparing a read signal with the reference signal by the differential type sense amplifier 3-1, it is possible to determine whether the read signal is "1" or "0."

The polarization inversion of such a ferroelectric capacitor can be performed at a high speed in about one nanosecond. Therefore the ferroelectric memory, though nonvolatile, can achieve as high an access speed as DRAM.

Incidentally, while a so-called folded bit line structure has been described in the above example, an open bit line structure or a structure for supplying a reference voltage directly to a sense amplifier without using a pair of bit lines is known as another structure. Principles of the operation and data determination are the same in these cases.

Patent Literatures 2 and 3 propose a cross point type ferroelectric memory as means for improving a degree of integration of the above-described ferroelectric memory.

FIG. 18 shows a circuit example of cross point type memory cells.

As shown in FIG. 18, cell strings SS (SS1, SS2 . . . ) include a plurality of (n) capacitors C1 to Cn connected to common node electrodes NE (NE1, NE2 . . . ).

The cell strings are connected to bit lines BL (BL1, BL2 . . . ) via access transistors Ta (Ta1, Ta2 . . . ) formed by a FET which transistors are controlled by word lines WL (WL1 . . .).

The capacitors C including the cell strings SS each store separate data, and are controlled by respective plate lines PL1 to PLn independent of each other.

In this circuit example, a potential of the bit line BL1 is detected by a sense amplifier 3-1, and a potential of the bit line BL2 is detected by a sense amplifier 3-2.

Data reading from the capacitor C1 of the cell string SS1 will be taken as an example.

In this case, when the word line WL1 is selected and a pulse is applied to the plate line PL1 with the plate lines PL2 to PLn fixed to 0 V, a different signal occurs in the bit line BL1 according to a direction of polarization of the ferroelectric capacitor C1 on the same principles as described above. The sense amplifier 3-1 compares the signal thus generated in the bit line BL1 with a reference signal supplied separately, and thereby determines whether the read signal is "1" or "0."

This cross point type cell structure, in which one access transistor Ta is shared by the plurality of capacitors C1 to Cn, effectively reduces a number of elements per bit, and is thus effective in reducing cost.

Incidentally, it is needless to say that the cross point type has many structural variations such as a folded bit line structure, an open bit line structure and the like.

Patent Literature 2 further proposes a memory structure as a development of the cross point type, provided with a mechanism for amplifying a read signal. FIG. 19 shows an example of the memory structure.

A cell string SS includes a plurality of (n) ferroelectric capacitors C1 to Cn connected to a common node electrode NE. The capacitors C1 to Cn each store separate data, and are controlled by respective plate lines PL1 to PLn independent of each other.

Further, a reading access transistor Tr, a writing access transistor Tw, and a sense transistor Ts each formed by a FET are provided.

The sense transistor Ts is a depletion type N-channel MOS-FET. The sense transistor Ts has a gate connected to the common node electrode NE. One of a source and a drain of the sense transistor Ts is connected to a ground potential, for example, and the other is connected to a bit line BL via the reading access transistor Tr.

One of a source and a drain of the reading access transistor Tr is connected to the sense transistor Ts, and the other is connected to the bit line BL. A gate of the reading access transistor Tr is connected to a reading word line WLr, so that on/off control of the reading access transistor Tr is effected by the reading word line WLr.

One of a source and a drain of the writing access transistor Tw is connected to the common node electrode NE, and the other is connected to the bit line BL. A gate of the writing access transistor Tw is connected to a writing word line WLw, so that on/off control of the writing access transistor Tw is effected by the writing word line WLw.

Data reading from the capacitor C1 will be taken as an example. In this case, the reading word line WLr is selected and a pulse is applied to the plate line PL1 with the plate lines PL2 to PLn fixed to 0 V.

Thereby a signal appears at the common node electrode NE according to a direction of polarization of the ferroelectric capacitor C1. At this time, the writing word line WLw is turned off (the writing access transistor Tw is off), and hence the common node electrode NE is disconnected from the bit line BL.

That is, a charge from the cell capacitor C1 drives only the gate electrode of the sense transistor Ts rather than directly driving the bit line BL. The sense transistor Ts, which is for example a depletion type NMOS transistor, drives the bit line BL according to a voltage applied to the gate of the sense transistor Ts. Thus, in this case, an amplified signal obtained by converting the signal appearing at the common node electrode NE appears in the bit line BL.

At the time of data writing, on the other hand, the writing word line WLw is selected, and thus the writing access transistor Tw is turned on. The reading access transistor Tr is turned off. Then, the common node electrode NE is connected to the bit line BL. By driving the bit line BL and a plate line PL to respective required states, an appropriate voltage as a potential difference between the bit line BL and the plate line PL(x) is applied to a selected capacitor C(x), so that data is written to the selected capacitor C(x).

Such an amplification type memory can effectively extract a signal from a minute ferroelectric capacitor because of its signal amplification effect, and is thus very advantageous for a higher degree of integration. Further, such an amplification type memory does not increase cell area because the sense transistor Ts and the like as an added circuit for amplification can be formed in an empty silicon region under the cell string SS.

As described above, the ferroelectric memory, though nonvolatile, can realize high-speed rewriting operation, and has a potential for realizing a capacity higher than that of DRAM. The cross point type having the signal amplifying function as shown in FIG. 19, in particular, is advantageous for miniaturization because the cross point type amplifies even a signal of a minute capacitor into a large signal.

However, as the ferroelectric capacitor is made smaller, an error rate is increased due to signal variations.

Ferroelectric film does not have small variations in crystal orientation and amount of polarization because of imperfectness of its crystal. Such variations are averaged in large capacitors and thus do not present much of a problem, but become noticeable as the capacitors are made smaller. For example, when capacitor area and load capacitance are both reduced to ¼, an average signal value is directly scaled and unchanged, while statistical variations are increased twofold.

This problem cannot be solved merely by amplifying signals because the variations are also amplified.

Incidentally, such variations depend greatly on variations of ferroelectric components, and are generally noticeable particularly on a high level side (corresponding to "1" data in this case).

Effects of such signal variations on data determination are illustrated in a conceptual diagram of FIG. 20A. In the figure, signal levels "0" and "1" of memory cells shown by cell signals CS1, CS2, and CS3 are both varied, as indicated by ● and ○. In addition, these signals are changed in a direction in which the "0" data and the "1" data approach each other, as indicated by x and Δ, due to data retention deterioration, disturb deterioration, and the like. For example, the cell signal CS1 changes with time from a state (α) to a state (β). That is, the "0" signal is raised in level, and the "1" signal is lowered in level, thus reducing a signal difference.

In determining data stored in memory cells, one reference signal corresponding to an intermediate level between "0" and "1" is used for the determination for the plurality of capacitors. A method is proposed in which for example one dummy capacitor for generating a reference potential is provided on a bit line and the determination for all memory cells on adjacent bit lines is made using the dummy capacitor.

Looking at a reference signal rf in FIG. 20A, however, the reference signal rf has a level appropriate for determining the cell signal CS1, for example, but causes an error with the cell signal CS2. An operating margin is further deteriorated with degradations with time of the signals as described above.

In order to solve such a problem, a method referred to as self-reference is proposed which makes an accessed capacitor itself generate a reference signal. This method is carried out by the following procedure.

1. After a first signal from initial data is obtained in a first reading, data corresponding to a low-level signal is temporarily written to the cell.

2. A second signal is obtained by performing a second reading.

3. The initial data is determined by comparing the first signal with a reference signal obtained by adding a fixed offset signal to the second signal.

In such a determination method, as shown in FIG. 20B, signals obtained by adding a fixed offset OF to a low level signal (corresponding to "0" data in this case) of each memory cell are provided as reference signals rf1, rf2, and rf3. Therefore variations on the "0" side are cancelled at all times.

However, variations on the "1" side, which are most problematic, are not cancelled. In addition, since a value of the offset OF is fixed for all cells, it is not possible to provide an optimum signal for each memory cell.

Thus, as shown in FIG. 20B, for example, even when the reference signal rf1 is appropriate for the cell signal CS1, the reference signal rf2 for the cell signal CS2 is too close to "1," while the reference signal rf3 for the cell signal CS3 has a level shifted to the "0" side.

Since a sense amplifier makes read data determination by sensing a difference between each cell signal and a reference signal, when there is an imbalance as described above, the sense amplifier cannot obtain a sufficient difference in a particular state of a particular cell, thus decreasing determination sensitivity.

Further, in the case of data retention degradation with time or the like, a "0" signal written as a reference is fresh, and is thus smaller than a retained "0" signal. Therefore too small an offset causes an error in reading of "0," and too large an offset causes an error in reading of "1." Thus setting of an appropriate value of the offset OF itself is very difficult.

The ferroelectric memory also has the following problem in writing operation.

Currently, the polarization inversion of the ferroelectric memory requires application of a voltage of 1.5 to 3 V. Lowering this value requires thinning ferroelectric film; however, this cannot be readily carried out because of problems of capacitor leakage and withstand voltage. On the other hand, with reduction in size of transistors, operating voltage of a logic circuit within a chip has continued to decrease, thus resulting in a mismatch between operating voltages of a memory device and other circuits.

The mismatch directly leads to a problem in that power consumption and access speed in memory writing cannot be improved even when the transistors are reduced in size.

The writing of "1" to the ferroelectric memory is performed by for example setting the bit line BL in FIG. 16 to a high with the word line WL in an on state and setting the plate line PL to a grounded state. Since the bit line BL is generally connected with many nonselected memory cells and thus has a very high load capacitance, charging and discharging of the bit line BL accounts for most of the power consumption in memory access.

For example, even when a logic within a chip can be operated at 1.0 V, 1.5 to 3 V needs to be applied to a bit line to effect polarization inversion of a cell capacitor. Thus power consumption required for charging and discharging the bit line is increased a number of times. In addition, since writing operation cannot be performed when the bit line is not completely charged to that potential, writing access time is lengthened.

SUMMARY OF THE INVENTION

In view of such problems, it is an object of the present invention to dramatically extend an operating margin in reading in a semiconductor memory device using a ferroelectric memory, for example, and thereby prevent erroneous reading, and propose a memory cell configuration and a data reading method that enable such reading at high speed and with low power consumption. It is another object of the present invention to propose a memory cell configuration and a writing method for performing writing operation at high speed and with low power consumption.

According to the present invention, there is provided a data reading method in a semiconductor memory device, the semiconductor memory device having a memory cell that stores data by state of polarization of a ferroelectric capacitor, the data reading method including: a first reading step for applying a first reading pulse to the memory cell to generate a first signal corresponding to the stored data; a writing step for writing reference signal generating data corresponding to a signal on a high level side to the memory cell; a second reading step for applying a second reading pulse to the memory cell to generate a second signal corresponding to the reference signal generating data; a reference signal generating step for generating a reference signal on a basis of the second signal; and a determining step for comparing the first signal with the reference signal, and determining the stored data stored in the memory cell.

Particularly preferably, in the first reading step and the second reading step, the first signal and the second signal are generated using a remaining signal after the reading pulse applied is returned from a high level to a low level.

The semiconductor memory device further includes switch means disposed between the memory cell and a constant-voltage node, and in the writing step, the reference signal generating data corresponding to the signal on the high level side is written to the memory cell by making the switch means conduct.

In the reference signal generating step, the reference signal is generated according to the second signal by converting the second signal to substantially ½.

The first signal and the second signal are generated according to a potential change occurring in a load capacitance, and in the reference signal generating step, the reference signal is generated by distributing the second signal to a load having a substantially identical capacitance.

The semiconductor memory device has a cell string configuration in which one terminal of each of a plurality of memory cells is connected to a common node electrode, the first signal and the second signal are generated according to a potential change occurring at the common node electrode, and in the reference signal generating step, the reference signal is generated by short-circuiting the common node electrode and a common node electrode of an adjacent cell string and converting the second signal occurring at the common node electrode to substantially ½.

According to the present invention, there is provided a data reading method in a semiconductor memory device, the semiconductor memory device including: a plurality of memory cells for passing a current corresponding to stored data through a bit line when selected to be read; a current supplying transistor disposed between the bit line and a constant-voltage node; and switch means disposed between a gate of the current supplying transistor and the bit line. The data reading method includes: a first reading step for short-circuiting the gate of the current supplying transistor and the bit line, and performing a first reading from a memory cell;

a second reading step for disconnecting the gate of the current supplying transistor from the bit line, and performing a second reading from the memory cell; and a determining step for determining the stored data stored in the memory cell according to a potential state of the bit line, the potential state occurring in the second reading step.

According to the present invention, there is provided a data writing method in a semiconductor memory device, the semiconductor memory device including: a memory cell connected to a bit line via a first switching element and storing data by state of polarization of a ferroelectric capacitor; and a second switching element disposed between the memory cell and a constant-voltage node. The data writing method includes: a first writing step for writing high-level data to the memory cell without using the bit line by making the second switching element conduct; and a second writing step for applying a high-level or low-level signal to the bit line and making the first switching element conduct.

Further, according to the present invention, there is provided a data writing method in a semiconductor memory device, the semiconductor memory device including: a plurality of memory cells storing data by state of polarization of a ferroelectric capacitor, and having a cell string configuration in which one terminal of each of the memory cells is connected to a common node electrode connected to a bit line via a first switching element; and a second switching element disposed between the common node electrode and a constant-voltage node. The data writing method includes: a first writing step for writing high-level data to a memory cell selected in the cell string configuration without using the bit line by making the second switching element conduct; and a second writing step for applying a high-level or low-level signal to the bit line and making the first switching element conduct.

According to the present invention, there is provided a semiconductor memory device including: a memory cell for storing data by state of polarization of a ferroelectric capacitor; reading means for selectively applying a reading pulse to the memory cell to generate a signal corresponding to the stored data, and applying a first reading pulse and a second reading pulse in one reading operation to the memory cell; writing means for, after the reading means applies the first reading pulse to the selected memory cell and a first signal corresponding to the stored data of the selected memory cell is generated, writing reference signal generating data corresponding to a signal on a high-level side to the selected memory cell before the reading means applies the second reading pulse; reference signal generating means for generating a reference signal on a basis of a second signal generated by applying the second reading pulse and corresponding to the reference signal generating data stored in the selected memory cell; and determining means for comparing the first signal with the reference signal, and determining the stored data stored in the memory cell.

Further, according to the present invention, there is provided a semiconductor memory device including: a plurality of memory cells connected to a bit line; reading means for reading a selected memory cell, and passing a current corresponding to data stored in the selected memory cell through the bit line; a current supplying transistor disposed between the bit line and a constant-voltage node; switch means disposed between a gate of the current supplying transistor and the bit line; and determining means for, when the reading means performs a first reading of the selected memory cell in a state in which the gate of the current supplying transistor and the bit line are short-circuited and then the reading means performs a second reading of the selected memory cell in a state in which the gate of the current supplying transistor and the bit line are disconnected from each other, determining the stored data stored in the selected memory cell according to a potential state of the bit line, the potential state being produced by the second reading.

Further, according to the present invention, there is provided a semiconductor memory device including: a memory cell connected to a bit line and storing data by state of polarization of a ferroelectric capacitor; and writing means disposed between the memory cell and a constant-voltage node, for writing data corresponding to a high-level signal to the memory cell without using the bit line.

Further, according to the present invention, there is provided a semiconductor memory device including: a plurality of memory cells connected to a bit line, storing data by state of polarization of a ferroelectric capacitor, and having a cell string configuration in which one terminal of each of the memory cells is connected to a common node electrode; and writing means disposed between the common node electrode and a constant-voltage node, for writing data corresponding to a high-level signal to the memory cells without using the bit line.

Further, according to the present invention, there is provided a semiconductor memory device including: a memory cell storing data by state of polarization of a ferroelectric capacitor, connected to a bit line via a first switching element, and connected to a constant-voltage node via a second switching element; first writing means for writing high-level data to the memory cell without using the bit line by making the second switching element conduct; and second writing means for writing low-level data to the memory cell by applying a low-level signal to the bit line and making the first switching element conduct.

Further, according to the present invention, there is provided a semiconductor memory device including: a memory unit having a cell string configuration in which one terminal of each of a plurality of memory cells storing data by state of polarization of a ferroelectric capacitor is connected to a common node electrode connected to a bit line via a first switching element and connected to a constant-voltage node via a second switching element; first writing means for writing high-level data to a memory cell selected in the cell string configuration without using the bit line by making the second switching element conduct; and second writing means for writing low-level data to the selected memory cell by applying a low-level signal to the bit line and making the first switching element conduct.

Thus, in the present invention as described above, at a time of data reading, a first reading of initial data from a memory cell is performed, then data corresponding to a high-level signal is written to the original cell, and a reference signal is generated on the basis of a signal read from the cell to be used for determining the initial data.

Further, a remaining signal after pulse application is used for the first signal and the second signal. Further, the reference signal is generated by converting the high-level signal read for the second time to substantially ½.

The reference signal is generated by distributing the high-level signal read for the second time to a load having substantially the same capacitance as a signal node.

The present invention also proposes memory cell mechanisms that enable the above operation to be performed at high speed and with efficiency. As one mechanism, a function is provided to write a high-level signal to each capacitor without driving the bit line in a configuration including one capacitor and one access transistor or a cross point type cell unit as described above. Specifically, the function is realized by additionally connecting a transistor having one side connected to a constant-voltage node (power source) to the signal node of a cell, for example.

Further, a function is provided to short-circuit adjacent signal nodes in an amplification type cross point type memory.

The present invention also proposes a new sensing system suitable for realizing self-reference as described above. Specifically, a current supplying transistor is provided for a bit line. A first reading is performed with a gate of the current supplying transistor connected to the bit line. The gate is disconnected from the bit line in a state of equilibrium in which the same current as a current flowing through the bit line flows through the transistor, so that the gate is brought into a floating state, and the potential of the gate is maintained. Then a second reading is performed. At this time, the same current as in the first reading flows through the current supplying transistor, and the bit line accumulates a charge corresponding to a difference between the first reading and the second reading. That is, an amplifying effect occurs in the bit line, so that a comparison between the first reading and the second reading is readily performed.

Further, the present invention provides a configuration in which a ferroelectric capacitor of each memory cell is connected to a constant-voltage node via a second switching element, whereby high-level data (for example "1") can be written to a selected capacitor without using a bit line. In writing arbitrary data to the ferroelectric capacitor, "1" is first written to all selected cells by applying a voltage from the constant-voltage node via the second switching element, and then only the desired cell is inverted to "0" via the bit line.

Alternatively, an FeRAM of the cross point type according to the present invention is configured such that in each memory unit, a common node electrode of a capacitor group of a cell string configuration is connected to a constant-voltage node via a second switching element, whereby "1" can be written to a selected capacitor without using a bit line. In writing arbitrary data to the ferroelectric capacitor, "1" is first written to all selected cells by applying a voltage from the constant-voltage node via the second switching element, and then only the desired cell is inverted to "0" via the bit line.

As is understood from the above description, the present invention provides the following effects.

The semiconductor memory device or the data reading method according to the present invention can cancel variations on a high-level side that are more problematic in a ferroelectric memory, and thus effectively decrease an error rate.

Further, in combination with use of remaining signals after pulse application, the semiconductor memory device or the data reading method according to the present invention can cancel variations on a low side at the same time, and thus provide an optimum reference signal for each memory cell without the need for generating an offset signal. Therefore accurate reading can be performed even when characteristics of each capacitor are varied.

Further, the reference signal can be generated properly with a minimum circuit scale by using distribution to a capacitive load.

In addition, by making switch means disposed between a memory cell and a constant-voltage node conduct and thereby writing reference signal generating data corresponding to a signal on a high level side to the memory cell, it is possible to write the data corresponding to the high level signal to a desired cell without charging and discharging a bit line. Therefore an operation for generating a reference signal can be performed at high speed and with low power consumption.

Further, in an amplification type cross point memory configuration, an internal signal within a unit can be converted into a reference signal readily and quickly by short-circuiting common node electrodes of adjacent units.

Further, a current supplying transistor disposed between a bit line and a constant-voltage node and switch means disposed between a gate of the current supplying transistor and the bit line are provided. A first reading from a memory cell is performed in a state in which the gate of the current supplying transistor and the bit line are short-circuited, then a second reading from the memory cell is performed in a state in which the gate of the current supplying transistor and the bit line are disconnected from each other, and stored data stored in the memory cell is determined according to a potential state of the bit line, the potential state being produced by the second reading. Thereby self-sensing can be performed reliably with a small circuit scale.

In addition, the semiconductor memory device or the data writing method according to the present invention can write "1" to a memory cell without using a bit line with a high load. Also, inversion of a desired cell to "0" does not require application of high voltage to the bit line. Therefore the need for charging and discharging the bit line at high voltage is eliminated throughout the data writing process, and the bit line can be driven at the same voltage as a logic circuit, for example. It is thereby possible to greatly reduce power consumption and also reduce time required for charging and discharging the bit line.

The operation of writing "1" to all selected cells can be performed at high speed in parallel with an operation of setting the bit line to a desired voltage according to data to be written. Therefore no overhead results from the addition of the "1" writing process, and total writing time can be reduced.

BRIEF DESCRIPTION OF THE DRAWINGS

FIGS. 1A and 1B are diagrams of assistance in explaining a data determination method according to the present invention, FIG. 1A showing states of remaining signals of cells when a pulse is returned from a high to a low, and FIG. 1B showing reference signals obtained by writing a high level and converting the high level to substantially ½;

FIG. 4 is a timing chart of data reading operation of the first embodiment;

FIG. 12 is a timing chart of data reading operation of the third embodiment;

FIG. 13 is a timing chart of data writing operation of the third embodiment;

FIGS. 15A and 15B are diagrams of assistance in explaining operation of the control circuit of the fourth embodiment, FIG. 15A representing an example in which a first bit line charge and reading is performed in a conducting state of a switch transistor SW4, and FIG. 15B representing an example in which a second bit line charge and reading is performed while the switch transistor SW4 remains turned off;

DETAILED DESCRIPTION OF THE PREFERRED EMBODIMENTS

Preferred embodiments of the present invention will hereinafter be described.

Prior to the description of configurations of the concrete embodiments, a concept of signal determination at a time of data reading according to the present invention will first be described in the following with reference to FIGS. 1A and 1B.

As described above, in the present invention, after a first reading of initial data, data corresponding to a signal at a high level rather than a low level is written to the original cell, and a reference signal is generated on the basis of a signal read from the cell and is used to determine the initial data.

While the present invention is effective in canceling variations on a high level side, the present invention is preferably effective particularly when combined with a reading method that returns a signal potential on a low level side to a reference level before reading.

Specifically, it suffices to read a remaining signal in a state in which a pulse is returned from a high to a low at the time of reading, rather than reading in the high state of the pulse. In such reading, if fresh, a low-level signal not involving polarization inversion returns to a state before the pulse is applied. On the other hand, on the high level side where polarization inversion is performed, a charge after the inversion remains as a signal.

States of remaining signals of cells when the pulse is returned from the high to the low are shown by cell signals CS11, CS12, and CS13 in FIG. 1A.

As in FIG. 1A and 1B, signal levels "0" and "1" of the memory cells shown by the cell signals CS11, CS12, and CS13 are varied, as indicated by ● and ○. These signals are changed in a direction in which the "0" data and the "1" data approach each other as indicated by x and Δ due to data retention deterioration, disturb deterioration, and the like.

Levels of reference signals obtained by writing a high level afresh and converting the high level to substantially ½ are shown as broken lines rf11, rf12, and rf13 in FIG. 1B.

The reference signals thus generated are set at optimum levels, or near intermediate points between "0" and "1," for respective capacitors. What is important is that data retention deteriorations with time of both "0" and "1" in particular have characteristics of progressing substantially symmetrically toward an intermediate value between "0" and "1".

Such characteristics of the ferroelectric capacitors allow substantially optimum reference signals to be given to even memory cells that have caused data retention deterioration when the fresh high level written for reference is reduced to substantially ½.

That is, after a first reading of initial data, data corresponding to a signal at a high level is written to the original cells, and the reference signals rf11, rf12, and rf13 are generated on the basis of signals read from the cells and are used to determine the initial data. Thereby data determination with fewer errors is made possible.

Figure 2:
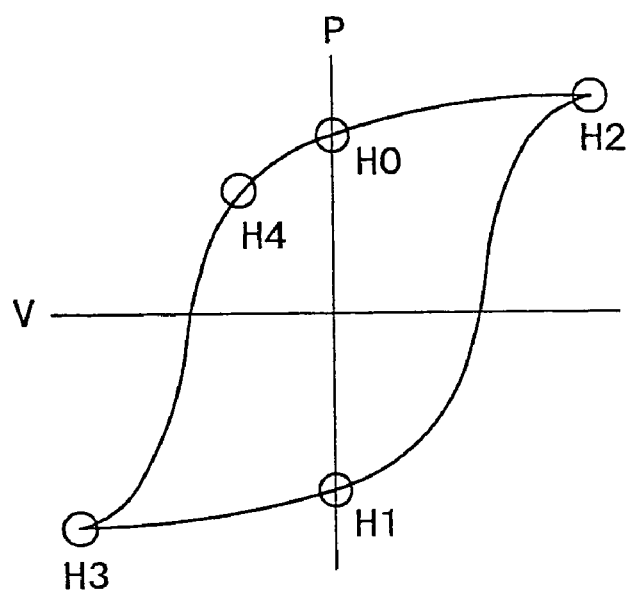
FIG. 2 is a diagram of assistance in explaining operation of a ferroelectric capacitor in the data determination method according to the present invention.

The behavior of ferroelectric capacitors when the pulse for reading data is returned from the high to the low will be described with reference to a hysteresis curve of FIG. 2.

In an initial state of reading, both electrodes of the capacitors connected to a plate line and bit lines are equalized to 0V, and the bit line side is in a floating state. The ferroelectric capacitors are polarized in a different direction according to data stored therein. For example, the capacitor with "0" is in an (H0) state, and the capacitor with "1" is in an (H1) state in FIG. 2.

When a Vcc pulse is applied to the plate line and thereby the plate line is brought into a high state, substantially Vcc is applied to both the capacitors. Both the capacitors are shifted to an (H2) state. When the plate line is then dropped to a low state, the capacitor on the "0" side returns to the original (H0) state, while the capacitor on the "1" side moves to (H4) with a charge after polarization inversion forming a remaining signal.

It is to be noted that this behavior is exhibited for fresh signals without data retention deterioration or the like. When there is deterioration with time, some remaining signal occurs also on the "0" side, while the remaining signal of "1" is reduced, as indicated by (γ) in FIG. 1A.

<First Embodiment>

A configuration and operation of a first embodiment will be described with reference to FIG. 3 and FIG. 4.

Figure 3:
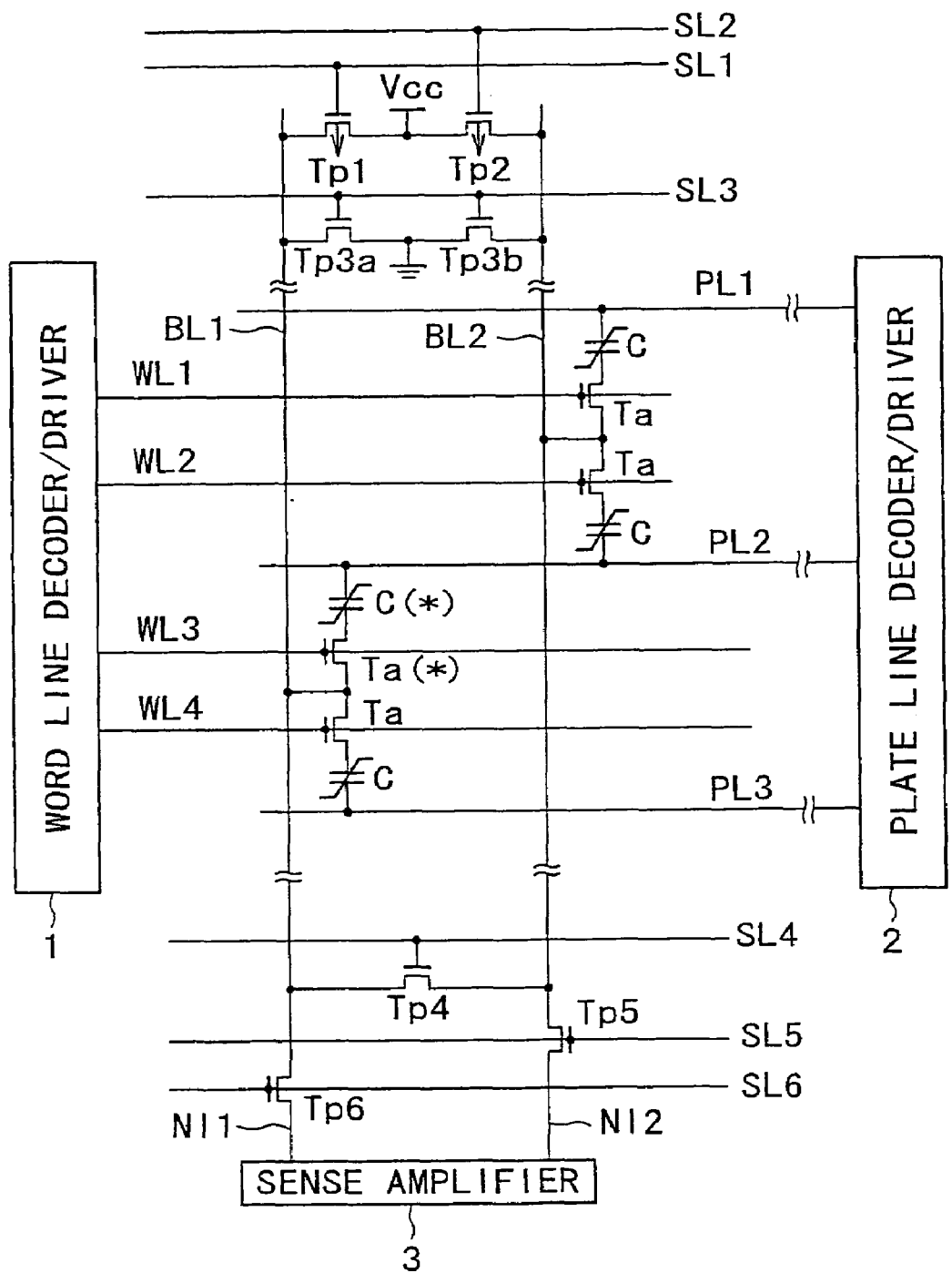
FIG. 3 is a diagram of assistance in explaining a configuration of a first embodiment of the present invention.

A memory cell in a structure shown in FIG. 3 is formed by one access transistor Ta and one ferroelectric capacitor C. The memory cell stores two values, that is, 1 bit according to a direction of polarization of the ferroelectric capacitor C.

A word line decoder/driver 1 applies a voltage to word lines WL (WL1, WL2 . . . ) according to an address to be accessed. A predetermined word line WL applies a voltage to a gate electrode of the access transistor Ta in each memory cell. Therefore the memory cell is selected by driving the word line WL.

Bit lines BL (BL1, BL2 . . . ) are arranged in a direction orthogonal to the word lines WL.

The bit lines BL1 and EL2 form a bit line pair whose potential is detected by a sense amplifier 3.

In each memory cell, the access transistor Ta is turned on by the word line WL, whereby the memory cell is connected to the corresponding bit line BL.

A plate line decoder/driver 2 applies a predetermined voltage to plate lines PL (PL1, PL2 . . . ).

A predetermined plate line PL is connected with one terminal of the capacitor C of each memory cell.

Further, control lines SL1, SL2, SL3, SL4, SL5, and SL6 are provided. The control lines SL are driven in respective predetermined timings as later described.

For example, the control line SL1 is connected to a gate of a pass transistor Tp1 formed by a P-channel MOSFET. One terminal of a source and a drain of the pass transistor Tp1 is connected to a fixed voltage Vcc, and another terminal of the pass transistor Tp1 is connected to the bit line BL1. The pass transistor Tp1 is turned on by the control line SL1 to thereby apply the voltage Vcc to the bit line BL1.

For example, the control line SL2 is connected to a gate of a pass transistor Tp2 formed by a P-channel MOSFET. One terminal of a source and a drain of the pass transistor Tp2 is connected to the fixed voltage Vcc, and another terminal of the pass transistor Tp2 is connected to the bit line BL2. The pass transistor Tp2 is turned on by the control line SL2 to thereby apply the voltage Vcc to the bit line BL2.

For example, the control line SL3 is connected to gates of pass transistors Tp3a and Tp3b formed by an N-channel MOSFET. One terminal of a source and a drain of each of the pass transistors Tp3a and Tp3b is connected to a ground node. Another terminal of the pass transistor Tp3a is connected to the bit line BL1, and another terminal of the pass transistor Tp3b is connected to the bit line BL2. The pass transistors Tp3a and Tp3b are turned on by the control line SL3 to thereby ground the bit lines BL1 and BL2.

For example, the control line SL4 is connected to a gate of a pass transistor Tp4 formed by an N-channel MOSFET. A source and a drain of the pass transistor Tp4 is connected to the bit lines BL1 and BL2, respectively. The pass transistor Tp4 is turned on by the control line SL4 to thereby short-circuit the bit lines BL1 and BL2.

For example, the control line SL5 is connected to a gate of a pass transistor Tp5 formed by an N-channel MOSFET. A source and a drain of the pass transistor Tp5 is connected to the bit line BL2 and an input node NI2 for the bit line BL2 of the sense amplifier 3. The pass transistor Tp5 is turned on by the control line SL5 to thereby input a potential of the bit line BL2 to the sense amplifier 3.

For example, the control line SL6 is connected to a gate of a pass transistor Tp6 formed by an N-channel MOSFET. A source and a drain of the pass transistor Tp6 is connected to the bit line BL1 and an input node NI1 for the bit line BL1 of the sense amplifier 3. The pass transistor Tp6 is turned on by the control line SL6 to thereby input a potential of the bit line BL1 to the sense amplifier 3.

A data reading operation will be described with reference to a timing chart of FIG. 4 by taking as an example data reading from a memory cell formed by a capacitor C(*) and an access transistor Ta(*) provided with (*) in FIG. 3 in such a configuration.

Timings including a reading cycle are denoted by S1 to S9 in FIG. 4. FIG. 4 shows voltage states corresponding to the following descriptions of the word line WL3, the plate line PL2, the bit lines BL1 and BL2, the control lines SL1, SL2, SL3, SL4, SL5, and SL6, and the input nodes NI1 and NI2 in each of the timings.

[Timing S1]

In an initial state immediately before timing S1, the plate line PL2, the bit lines BL1 and BL2, and the input nodes NI1 and NI2 of the differential type sense amplifier 3 are all equalized to 0 V. That is, the pass transistors Tp3a, Tp3b, Tp5, and Tp6 are in an on state.

As shown in FIG. 4, in timing S1, the word line WL3 for the selected cell is turned on to connect the capacitor C(*) to the bit line BL1, and the control lines SL3, SL5, and SL6 are turned off, whereby the NMOS pass transistors Tp3a, Tp3b, Tp5, and Tp6 are turned off to bring the bit lines BL1 and BL2 into a floating state.

[Timing S2]

A pulse is applied to the plate line PL2 to read a signal from the ferroelectric capacitor C(*). As shown in FIG. 4, when the pulse applied to the plate line PL2 is returned from a high to a low before timing S3, a remaining signal of "0" or "1" occurs in the bit line BL1 according to data stored in the capacitor C(*). The word line WL3 is turned off after the pulse applied to the plate line PL2 is thus changed from the high to the low, whereby a read signal (potential of the bit line BL1) is determined.

[Timing S3]

The control line SL6 is brought into an on state to turn on the pass transistor Tp6, whereby the signal of the bit line BL1 is transmitted to the input node NI1 of the sense amplifier 3. The control line SL6 is thereafter brought into an off state to turn off the pass transistor Tp6, whereby the signal transmitted to the input node NI1 is stored.

[Timing S4]

Next, the word line WL3 is turned on again, and the control line SL1 for the PMOS pass transistor Tp1 is turned on to thereby charge the bit line BL1 to Vcc. Thereby "1" as a signal on the high level side is written to the capacitor C(*).

[Timing S5]

The control line SL3 is turned on to equalize the bit lines BL1 and BL2 to 0 V again. The control line SL3 is thereafter turned off to bring the bit lines BL1 and BL2 into a floating state.

[Timing S6]

A pulse is applied to the plate line PL2 again to read a signal from the capacitor. C(*). When the pulse applied to the plate line PL2 is returned from a high to a low, a remaining signal of "1" written to the capacitor C(*) occurs in the bit line BL1. The word line WL3 is turned off after the pulse applied to the plate line PL2 is changed to the low, whereby a second read signal (potential of the bit line BL1) is determined.

[Timing S7]

The control line SL4 is turned on so that the pass transistor Tp4 conducts to short-circuit the bit line BL1 and the adjacent bit line BL2. Thereby the signal charge is distributed to the adjacent bit lines, and the potential is converted to substantially ½ of the potential, whereby an optimum reference signal is generated. The control line SL4 thereafter remains turned off.

[Timing S8]

The control line SL5 is brought into an on state to turn on the pass transistor Tp5, whereby the signal of the bit line BL2 is transmitted to the input node NI2 of the sense amplifier 3. The control line SL5 is thereafter brought into an off state to turn off the pass transistor Tp5, whereby the signal transmitted to the input node NI2 is stored.

[Timing S9]

The differential type sense amplifier 3 is activated to compare and amplify the signals of the input nodes NI1 and NI2. Thereby the cell data read in timing S2 is determined on the basis of the reference signal generated in timing S7.

In the meantime, the control line SL3 is turned on to return the bit lines BL1 and BL2 to the initial state equalized to 0 V.

With such a data determination method, the reference potential is generated so as to be automatically adjusted to around an intermediate value between "0" and "1" for each memory cell on the basis of the "1" data written to the read memory cell itself. That is, reference signals rf11, rf12, rf13 . . . as shown in FIG. 1B can be obtained. It is therefore possible to obtain a very high operating margin and thus perform data determination without errors even when characteristics of ferroelectric films vary.

It is to be noted that while the example of FIG. 3 illustrates a folded bit line structure, a similar system can of course be used in a case of open bit lines. Also, the above method is similarly applicable to a cross point type.

Further, there is a variation of the method of extracting signals from a ferroelectric memory. For example, a Symposium on VLSI Circuit digest paper, 12-3 (p127) proposes a method of transferring a signal charge occurring in a bit line to a second load capacitance connected to the bit line, and sensing a change in potential of the second load capacitance. Also in such a case, the signal occurring in the bit line is used for sensing. When the signal on the high level side is distributed between the bit line and the adjacent second load capacitance, an appropriate reference signal can be obtained in a similar manner.

Figure 5A:
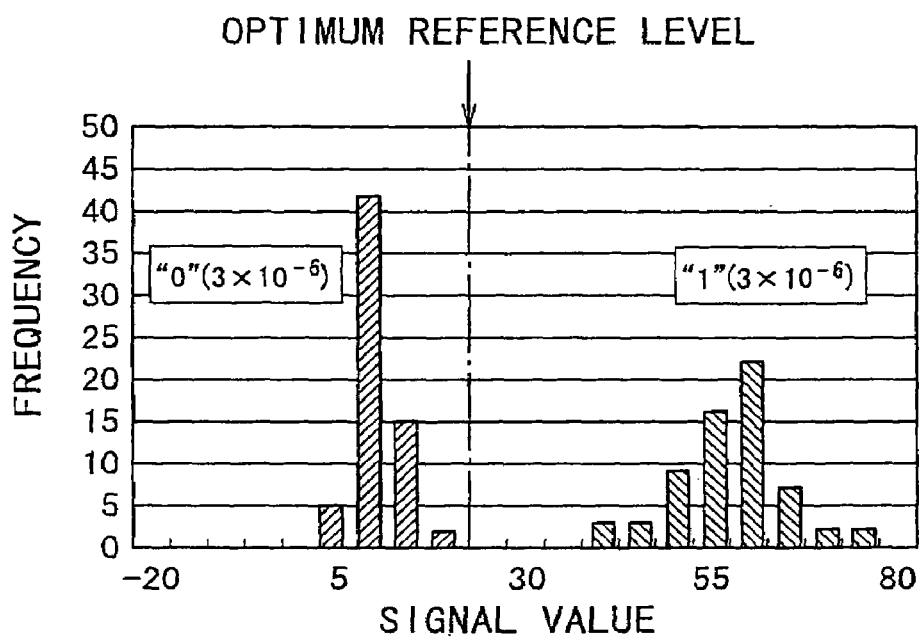
FIGS. 5A and 5B are diagrams of assistance in explaining improving effects of the embodiment, FIG. 5A showing an example of distribution of remaining signals when a pulse is simply dropped from a high to a low in a normal (not amplification type) cross point type, and FIG. 5B showing relative distributions of "1" and "0" signals when the present invention is applied and a signal obtained by converting a fresh high-level signal for each bit to substantially ½ is used as a reference.
Figure 5B:
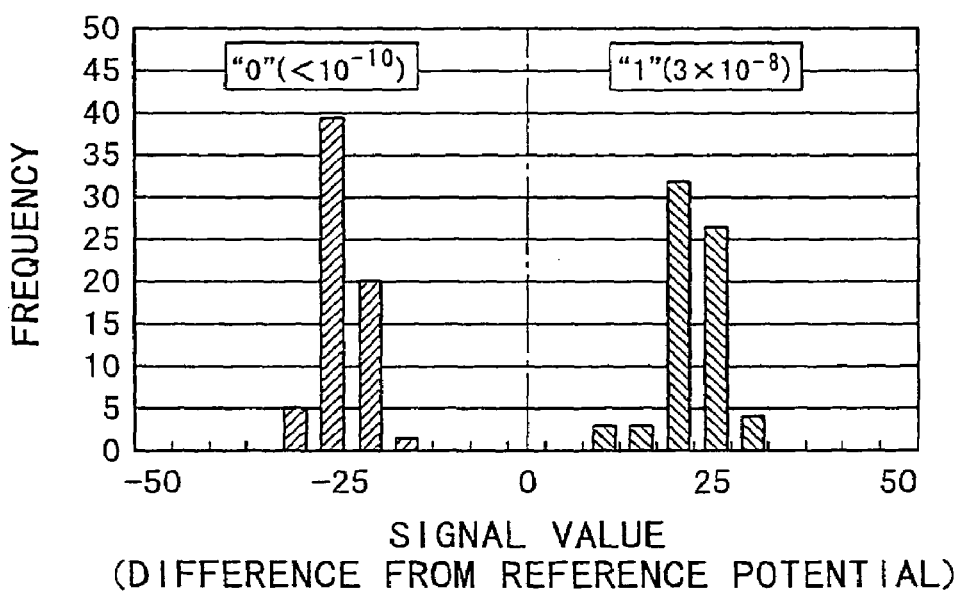

FIGS. 5A and 5B show an example of an improved signal distribution of a cross point type ferroelectric memory in reading operation using this example.

FIG. 5A shows an example of distribution of remaining signals when a pulse is simply dropped from a high to a low in a normal (not amplification type) cross point type. When a single reference signal is given to the most appropriate position with this example as normal distributions, an error rate is estimated to be $3 \times 10^{-6}$. However, it is very difficult to estimate such an optimum position in a design stage and generate a reference signal at the position without an error. An actual error rate is further deteriorated.

On the other hand, FIG. 5B shows relative distributions of "1" and "0" signals when the above method according to the present invention is applied and a signal obtained by converting a fresh high-level signal for each bit to substantially ½ is used as a reference.

In this case, the distribution of "1" signals in particular is improved significantly, with the error rate reduced to $3 \times 10^{-8}$. In addition, in this case, reference signals are generated automatically, so that the above-mentioned difficulty in generating the reference signal is eliminated.

<Second Embodiment>

When the bit line BL is charged to the voltage Vcc to write "1" for reference to the capacitor C as described above, charge and discharge of bit line capacitance is required more than is conventional, so that the charge takes time and also power consumption is increased. Since the bit line generally has a capacitance ten times or more that of a memory cell capacitor, it is desirable to avoid such waste.

Figure 6:
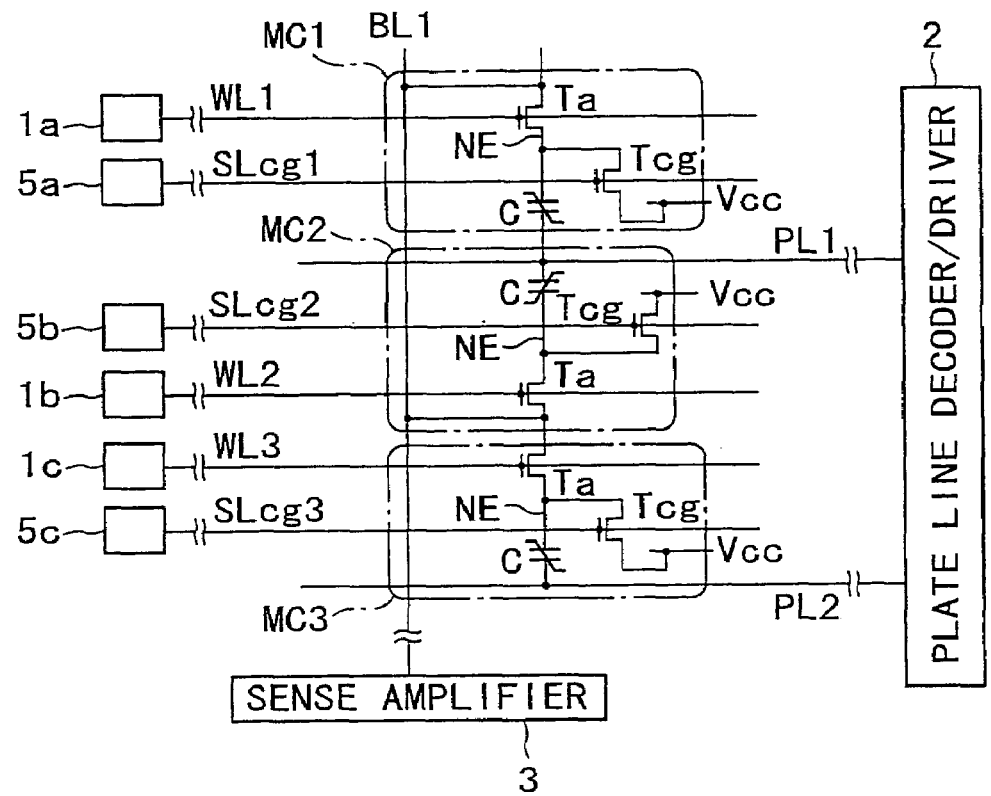
FIG. 6 is a diagram of assistance in explaining a configuration of a second embodiment of the present invention.

This problem can be solved by providing a mechanism for writing "1" into a memory cell without using the bit line. Such a configuration of a second embodiment is shown in FIG. 6.

In this case, memory cells MC1, MC2, MC3 . . . each have a capacitor C and an access transistor Ta as in FIG. 3. In addition, the memory cells MC1, MC2, MC3 . . . further include a charging transistor Tcg for charging the capacitor C with a voltage Vcc.

The access transistor Ta of each memory cell MC has a gate connected to a word line WL (WL1, WL2 . . . ), and is thus controlled by a word line decoder/driver 1 (1a, 1b . . . ).

The charging transistor Tcg of each memory cell MC has a gate connected to a charge control line SLcg (SLcg1, SLcg2 . . . ), and is thus controlled by a charging driver 5 (5a, 5b . . . ).

One of a drain and a source of the charging transistor Tcg is connected to a constant voltage node (for example Vcc), and the other of the drain or the source of the charging transistor Tcg is connected to a point connecting the capacitor C with the access transistor Ta (internal node NE).

Figure 7:
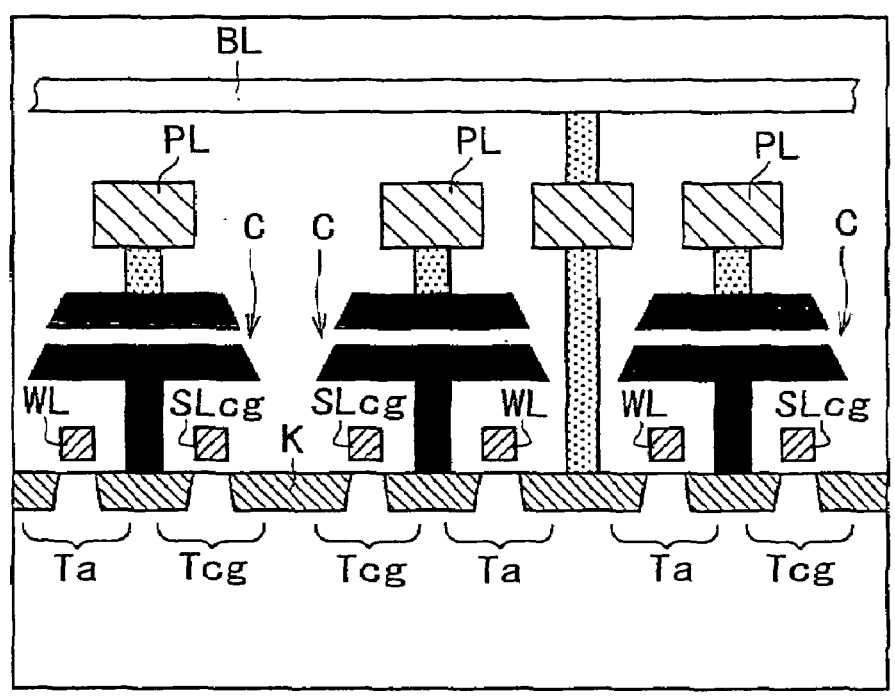
FIG. 7 is a diagram of assistance in explaining a structure of the second embodiment.

FIG. 7 is a sectional view when the configuration of FIG. 6 is adopted.

Plate lines PL are arranged in a direction orthogonal to a bit line BL (in a direction of depth of the drawing). A ferroelectric capacitor C is formed with a ferroelectric film interposed between each plate line PL and a contact part from a diffused layer.

As shown in FIG. 7, the word lines WL for access and the charge control lines SLcg are arranged in the direction of depth of the drawing. The access transistors Ta and the charging transistors Tcg having the gates connected to the word lines WL and the charge control lines SLcg, respectively, are formed as shown in FIG. 7.

A diffused layer K as a line for supplying the voltage Vcc is used as one of the source and drain of the charging transistor Tcg. The diffused layer K is shared between adjacent cells to thereby minimize increase in cell area.

With the configuration as shown in FIG. 6 and FIG. 7, by grounding the plate line PL, and setting the charge control line SLcg to a high level and thereby turning on the charging transistor Tcg, it is possible to apply the voltage to the capacitor C of the memory cell MC on a selected ROW address without using the bit line BL, and thus write "1" at high speed.

That is, the processing performed in timing S4 in FIG. 4, or the operation of writing "1" to the capacitor C by charging the bit line can be performed only by turning on the charging transistor Tcg without charging the bit line.

Thus, a time taken by the bit line charge is reduced, and also power consumption is reduced.

Such a function of writing "1" provides various conveniences in addition to the above use. For example, when "1" is desired to be written simultaneously to cells on a desired word line, the writing of "1" can be performed at higher speed and with lower power consumption than normal writing. There can be such a use in actual rewriting such as solidly filling a figure or the like. The function can also be applied to an operation of writing "0" and "1" alternately to restore ferroelectric film from imprint deterioration, for example.

Then, with the charging transistor Tcg as shown in FIG. 6, an ideal operation is realized as writing operation.

Figure 8:
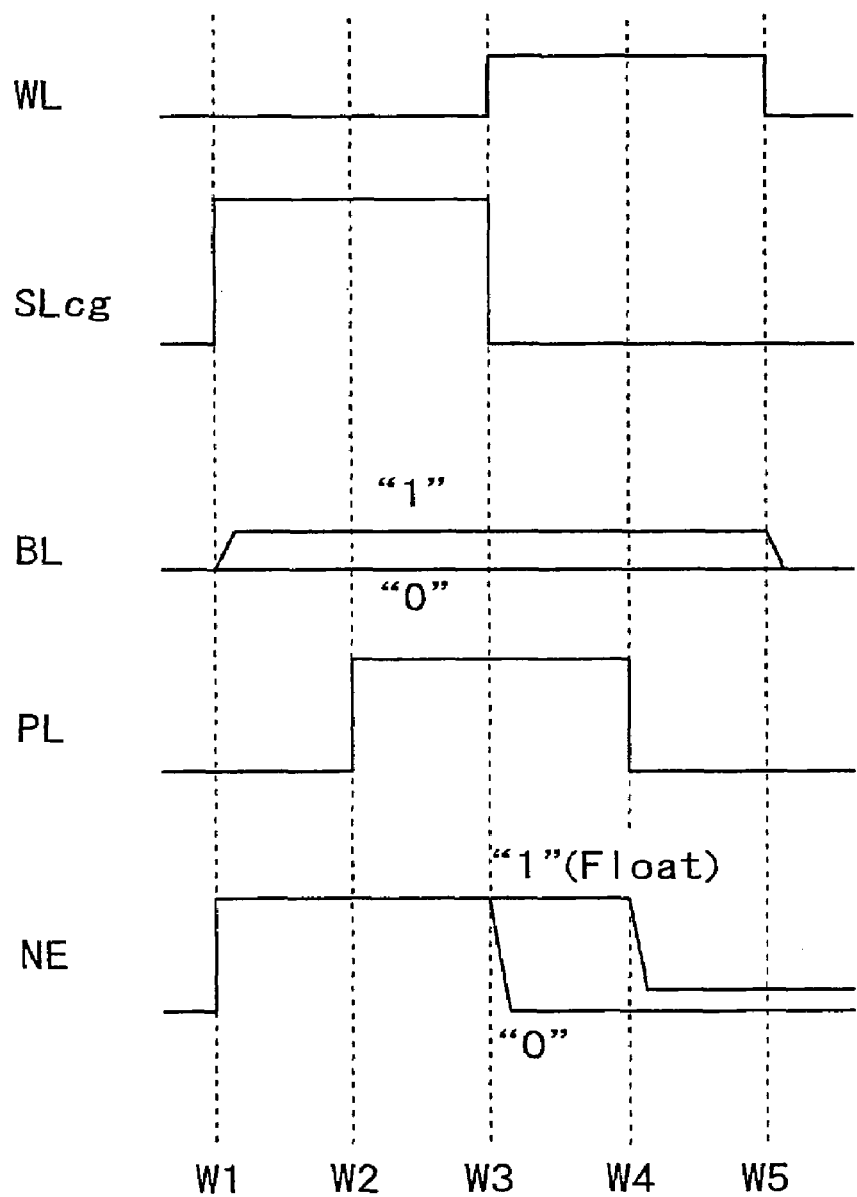
FIG. 8 is a timing chart of data writing operation of the second embodiment.

FIG. 8 is a timing chart of writing operation.

Timings including a writing cycle are denoted by W1 to W5 in FIG. 8. FIG. 8 shows voltage states of the word line WL, the charge control line SLcg, the bit line BL, the plate line PL, and the internal node NE in each of the timings. It is to be noted that the word line WL, the charge control line SLcg, the bit line BL, the plate line PL are each a line corresponding to the memory cell selected for writing.

In this example, an operation of accessing the memory cell is performed by two powers of 1 V and 2 V. The bit line BL and the selecting word line WL are operated at 1 V, and the plate line PL and the charge control line SLcg are operated at 2 V and 3 V, which is raised from 2 V. 2 V is used for charging power Vcc supplied to the memory cell via the charging transistor Tcg.

An operating procedure is as follows.

[Timing W1]

The charge control line SLcg is driven to a high level (3 V), so that the charging transistor Tcg is made to conduct to charge the internal node NE, or one terminal of electrodes of the ferroelectric capacitor C to 2 V.

At this time, the plate line PL is grounded, and therefore 2 V is applied to the capacitor C, whereby "1" is written to the capacitor C.

In the meantime, a signal corresponding to desired data to be written is applied to the bit line BL. Specifically, the bit line BL is set to 0 V when "0" is desired to be written, while the bit line BL is set to 1 V when "1" is desired to be written.

[Timing W2]

The plate line PL is set to 2 V, and the writing of "1" is ended.

[Timing W3]

The charge control line SLcg is set to a low to turn off the charging transistor Tcg. Also, the selecting word line WL is driven to a high (1 V). At this time, when the bit line BL is at 0 V (that is, the data to be written is "0"), the access transistor Ta is turned on to drive the node NE to 0 V. Since the plate line PL is set at 2 V, −2 V is applied to the capacitor C, whereby "0" is written to the capacitor C.

On the other hand, when the bit line BL is at 1 V (that is, the data to be written is "1"), the access transistor Ta remains off, and therefore the node NE remains at 2 V in a floating state. Thus, the capacitor C stores "1" written in timing W1 as it is.

[Timing W4]

The plate line PL is set to 0 V, and the writing of "0" is ended.

[Timing W5]

The word line WL is turned off, and the bit line BL is returned to 0 V, whereby the writing process is completed.

The writing in such a procedure requires only an amplitude of 1 V for the bit line BL, and thus reduces power consumption significantly. In addition, the writing of "1" and the driving of the bit line can be performed in parallel with each other in timing W1, which is effective in reducing access time.

<Third Embodiment>

Figure 9:
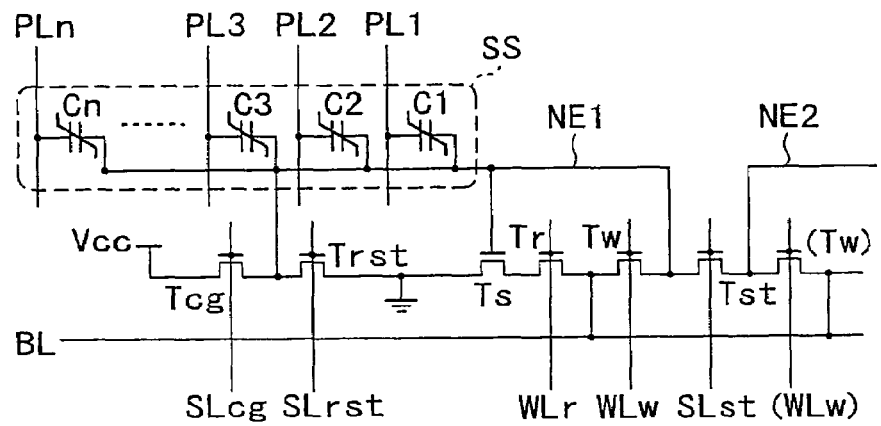
FIG. 9 is a diagram of assistance in explaining a configuration of a third embodiment of the present invention.

FIG. 9 shows an example of configuration of an amplification type cross point type memory according to a third embodiment.

This example includes a Vcc charge mechanism as in the foregoing second embodiment, and a mechanism for distributing a signal between adjacent units.

FIG. 9 shows one memory unit part. A cell string SS includes a plurality of (n) capacitors C1 to Cn connected to a common node electrode NE1.

The capacitors C including the cell string SS each store separate data, and are controlled by respective plate lines PL1 to PLn independent of each other.

Further, a reading access transistor Tr, a writing access transistor Tw, and a sense transistor Ts each formed by a FET are provided.

The sense transistor Ts is a depletion type N-channel MOS-FET. The sense transistor Ts has a gate connected to the common node electrode NE1. One of a source and a drain of the sense transistor Ts is connected to a ground potential, for example, and the other is connected to a bit line BL via the reading access transistor Tr.

One of a source and a drain of the reading access transistor Tr is connected to the sense transistor Ts, and the other is connected to the bit line BL. A gate of the reading access transistor Tr is connected to a reading word line WLr, so that on/off control of the reading access transistor Tr is effected by the reading word line WLr.

One of a source and a drain of the writing access transistor Tw is connected to the common node electrode NE1, and the other is connected to the bit line BL. A gate of the writing access transistor Tw is connected to a writing word line WLw, so that on/off control of the writing access transistor Tw is effected by the writing word line WLw.

Further, a resetting transistor Trst, a voltage Vcc charging transistor Tcg, and a signal distributing transistor Tst are disposed within the memory unit in FIG. 9.

One of a source and a drain of the resetting transistor Trst is connected to the common node electrode NE1, and the other is grounded. A gate of the resetting transistor Trst is connected to a reset control line SLrst, so that on/off control of the resetting transistor Trst is effected by the reset control line SLrst.

The resetting transistor Trst makes it possible to ground the common node electrode NE1, or a node for receiving a signal from the capacitors C, without using the bit line BL.

One of a source and a drain of the charging transistor Tcg is connected to the common node electrode NE1, and the other is connected to a node of a fixed voltage Vcc. A gate of the charging transistor Tcg is connected to a charge control line SLcg, so that on/off control of the charging transistor Tcg is effected by the charge control line SLcg.

The charging transistor Tcg makes it possible to charge the common node electrode NE1 to the voltage Vcc without using the bit line BL.

One of a source and a drain of the signal distributing transistor Tst is connected to the common node electrode NE1, and the other is connected to a common node electrode NE2 of an adjacent memory unit. A gate of the signal distributing transistor Tst is connected to a signal distribution control line SLst, so that on/off control of the signal distributing transistor Tst is effected by the signal distribution control line SLst.

The signal distributing transistor Tst makes it possible to short-circuit the common node electrode NE1 and the common node electrode NE2 of the adjacent memory unit.

Figure 10:
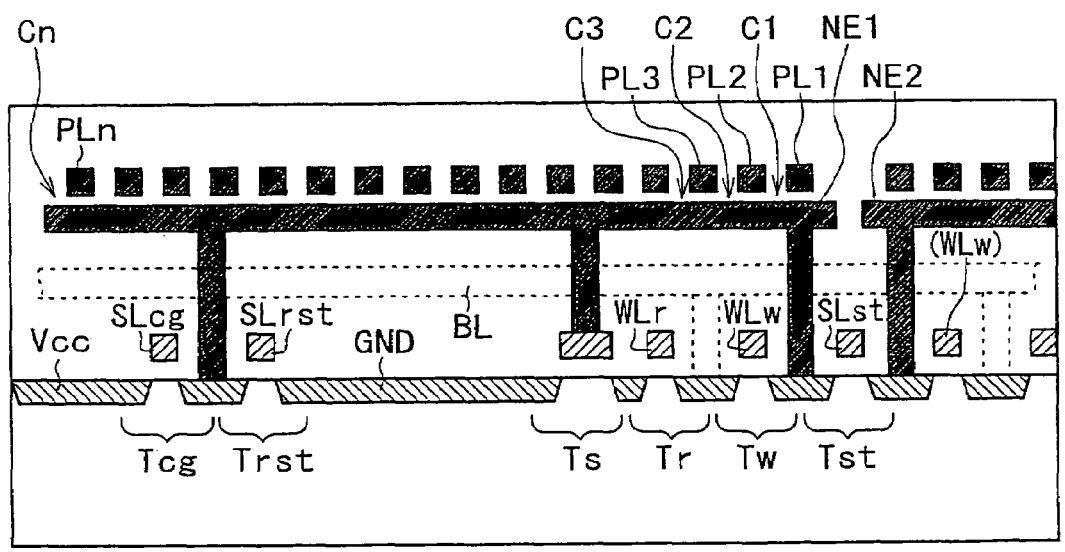
FIG. 10 is a diagram of assistance in explaining a structure of the third embodiment.

FIG. 10 is a sectional view of an example of arrangement of these transistors.

The plate lines PL1 to PLn are arranged in a direction orthogonal to the bit line BL (in a direction of depth of the drawing). The ferroelectric capacitors C1 to Cn are formed with a ferroelectric film interposed between the plate lines PL and the common node electrode NE1 connected to a contact part from a diffused layer.

As shown in FIG. 10, the reading word line WLr, the writing word line WLw, the charge control line SLcg, the reset control line SLrst, and the signal distribution control line SLst are arranged in the direction of depth of the drawing.

The reading access transistor Tr, the writing access transistor Tw, the charging transistor Tcg, the resetting transistor Trst, and the signal distributing transistor Tst whose gates are connected to the reading word line WLr, the writing word line WLw, the charge control line SLcg, the reset control line SLrst, and the signal distribution control line SLst, respectively, are formed in a manner as shown in FIG. 10.

Ground wiring (GND) and power supply wiring (VCC) are formed by a diffused layer, and arranged in the same direction as the word lines WLw and WLr, together with the transistor control lines (SLcg, SLrst, and SLst).

These transistors (Tcg, Trst, and Tst) and the control line wiring (SLcg, SLrst, and SLst) are arranged in layers under the capacitors C, whereby the transistors (Tcg, Trst, and Tst) and the control line wiring (SLcg, SLrst, and SLst) are added without increasing cell area.

Figure 11:
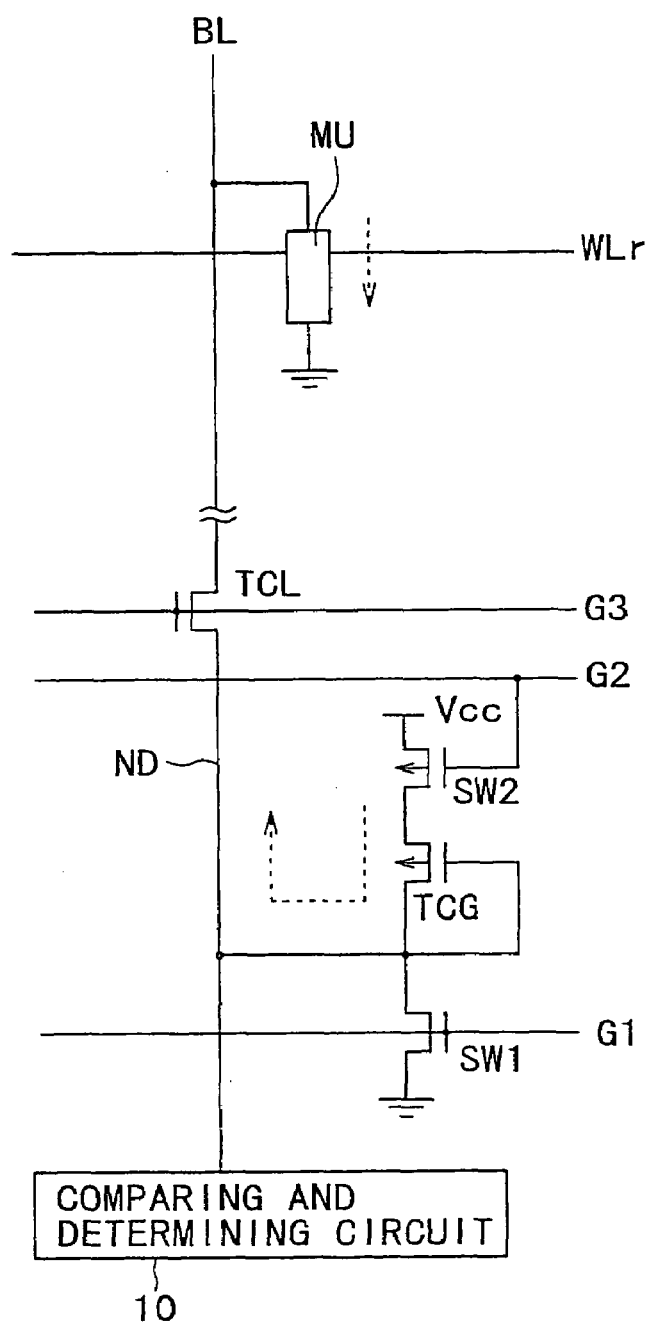
FIG. 11 is a diagram of assistance in explaining a configuration of a control circuit of the third embodiment.

FIG. 11 shows an example of a control circuit for operation of reading from the memory unit formed as shown in FIG. 9.

The memory unit MU in FIG. 11 has the configuration of FIG. 9. Incidentally, in FIG. 11, only the reading word line WLr is shown as wiring in the word line direction, and the other lines are omitted.

The bit line BL is provided with a clamp transistor TCL.

A source and a drain of the clamp transistor TCL are connected to the bit line BL and an input node ND of a comparing and determining circuit 10, respectively.

By setting a control line G3 connected to a gate of the clamp transistor TCL to Vcc/2, for example, the clamp transistor TCL clamps a potential of the bit line BL with a large parasitic capacitance to (Vcc/2−Vth), and thus holds its amplitude very low.

Further, a transistor SW2 formed by a P-channel MOS-FET, a transistor TCG, and a transistor SW1 formed by an N-channel MOSFET are provided as a circuit for charging the bit line and the input node ND.

A gate of the transistor SW2 is connected to a control line G2. One of a source and a drain of the transistor SW2 is connected to a node of the fixed voltage Vcc, and the other is connected to the transistor TCG. That is, the transistor SW2 serves as a charging switch.

A gate of the transistor SW1 is connected to a control line G1. One of a source and a drain of the transistor SW2 is grounded, and the other is connected to the input node ND and the transistor TCG. That is, the transistor SW1 serves as a grounding switch.

A gate and one of a source and a drain of the transistor TCG are connected to the input node ND.

The transistor TCG in a state of equilibrium supplies the same current as a current flowing in the memory unit to the bit line BL, whereby a different potential corresponding to the memory unit current occurs at the input node ND of the comparing and determining circuit 10.

The comparing and determining circuit 10 performs data determination by comparing an input potential occurring in a first reading with a reference input potential occurring in a second reading.

A concrete memory reading operation using the memory unit of FIG. 9 and the control circuit of FIG. 11 will be described with reference to a timing chart of FIG. 12. Reading from the capacitor C1 in FIG. 9 will be taken as an example.

Timings including a reading cycle are denoted by s1 to s9 in FIG. 12. FIG. 12 shows voltage states corresponding to the following descriptions of the reading word line WLr, the plate line PL1, the plate lines PL2 to PLn, the common node electrodes NE1 and NE2, the reset control line SLrst, the charge control line SLcg, the signal distribution control line SLst, the input node ND, and the control lines G2 and G1 in each of the timings.

[Timing s1]

In an initial state, the common node electrode NE1 and the plate lines PL1 to PLn within the memory unit MU are all grounded at 0 V. The bit line BL and the input node ND for input to the determining circuit are also grounded.

In timing s1, the reset control line SLrst is turned off to set the common node electrode NE1 to a floating state, and the transistor SW1 is turned off and the transistor SW2 is turned on by the control lines G1 and G2 to start charging the bit line BL and the input node ND.

[Timing s2]

A pulse is applied to the plate line PL1 to read a signal from the ferroelectric capacitor C1. When the pulse applied to the plate line PL1 is returned from a high to a low before timing s3, a remaining signal of "0" or "1" occurs in the common node electrode NE1 according to data stored in the capacitor C1.

[Timing s3]

The reading word line WLr is turned on. Thereby a current dependent on a level of the common node electrode NE1 flows in the memory unit MU, and a potential of the input node ND is varied depending on that level, so that a signal corresponding to a first reading is generated. The comparing and determining circuit 10 stores the signal.

[Timing s4]

Next, in a state in which the selecting plate line PL1 of the selected unit is set to 0 V, and the other plate lines PL2 to PLn are set to a floating state, the charge control line SLcg is turned on to charge the common node electrode NE1 within the memory unit to the voltage Vcc without using the bit line BL. Thereby "1" as a signal on the high level side is written to the capacitor C1.

[Timing s5]

The reset control line SLrst of the selected unit is turned on to equalize the common node electrode NE1 to 0 V again. The reset control line SLrst is thereafter turned off to bring the common node electrode NE1 into a floating state. The plate lines PL1 to PLn are all grounded.

[Timing s6]

A pulse is applied to the plate line PL1 again to read a signal from the capacitor C1. When the pulse is returned from a high to a low, a remaining signal of "1" written to the capacitor C1 in timing s4 occurs at the common node electrode NE1.

[Timing s7]

The signal distribution control line SLst is turned on to short-circuit the common node electrode NE1 of the selected unit and the common node electrode NE2 of the nonselected adjacent unit. Thereby the signal charge is distributed to the adjacent electrodes, and the potential is converted to substantially ½ of the potential, whereby an optimum reference potential is generated. The signal distribution control line SLst thereafter remains turned off.

[Timing s8]

The reading word line WLr is turned on. Thereby a current dependent on a level of the common node electrode NE1 flows in the memory unit MU, and a potential of the input node ND is varied depending on that level, so that a reference signal corresponding to the reference potential is generated. The comparing and determining circuit 10 determines data by comparing the signal stored in the above timing s3 with the reference signal.

[Timing s9]

The control line G2 is turned off to stop the circuit for charging the bit line BL, and the control line G1 is turned on to return the bit line BL to a grounded state. Further, the reset control line SLrst of the selected unit and a reset line of the adjacent unit not shown in the figure are turned on to return the common node electrodes NE1 and NE2 to a grounded state.

In the reading operation as described above, "1" for reference is written to the memory cell without charging and discharging the bit line BL, so that reading at high speed and with low power consumption is made possible.

Incidentally, the comparing and determining circuit 10 may be formed by applying the system described above with reference to FIG. 3, in which the signal corresponding to the first reading and the reference signal are selected by switches to flow to the input pair of the sense amplifier 3. However, there can be various other determining circuits.

An ISSCC 2003 paper digest, 16.1 (p278), for example, describes a comparing and determining circuit having a comparator formed by an inverter with a short switch between an input and an output. This comparing and determining circuit can be used.

A useful writing operation can be realized also in a cross point type memory as shown in FIG. 9, using the charging transistor Tcg.

FIG. 13 is a timing chart of the writing operation.

Timings including a writing cycle are denoted by W11 to W19 in FIG. 13. FIG. 13 shows voltage states of the writing word line WLw, the charge control line SLcg, the selected plate line PL1, the nonselected plate lines PL2 to PLn, the bit line BL, and the common node electrode NE1 in each of the timings. It is to be noted that in this example, writing is performed to the capacitor C1, and hence the selected plate line is PL1.

In this example, an operation of accessing the memory cell is performed by two powers of 1 V and 2.1 V. The bit line BL and the writing word line WLw are operated at 1 V, and the plate lines (PL1 to PLn) and the charge control line SLcg are operated at 2.1 V and 3.0 V, which is raised from 2.1 V. 2.1 V is used for charging power Vcc supplied to the memory cell via the charging transistor Tcg.

Incidentally, the reading word line WLr and the reset control line SLrst are off at all times during the writing, and may be operated at 1 V, which is not shown in the timing chart.

A procedure of the operation is as follows.

[Timing W11]

The charge control line SLcg is driven to a high level (3 V), so that the charging transistor Tcg is made to conduct to charge the common node electrode NE1 connected with the ferroelectric capacitor group (cell string SS) to 2.1 V.

At this time, the selected plate line PL1 is grounded, and therefore 2.1 V is applied to the selected capacitor C1, whereby "1" is written to the selected capacitor C1.

The nonselected plate lines (PL2 to PLn) are in a floating state, and are raised to about 2.1 V due to coupling with the common node electrode NE1, so that no voltage is applied to the nonselected capacitors (C2 to Cn).

In the meantime, a signal corresponding to desired data to be written is applied to the bit line BL. Specifically, the bit line BL is set to 0 V when "0" is desired to be written, while the bit line BL is set to 1 V when "1" is desired to be written.

[Timing W12]

All the plate lines (PL1 to PLn) are equalized to 1.4 V, that is, (⅔) Vcc. Accordingly, 0.7 V is applied to the nonselected capacitors (C2 to Cn), but the low value effects practically no state change.

[Timing W13]

The charge control line SLcg is returned to a low to turn off the charging transistor Tcg, whereby the common node electrode NE1 is disconnected from Vcc and brought into a floating state.

[Timing W14]

All the plate lines (PL1 to PLn) are driven to 0.7 V, that is, (⅓) Vcc. Accordingly, the common node electrode NE1 is driven by coupling with the plate lines and the potential of the common node electrode NE1 is decreased from 2.1 V to about 1.4 V.

[Timing W15]

Next, the writing word line WLw is driven to a high level (1 V). At this time, when the bit line BL is at 0 V (that is, the data to be written is "0"), the writing access transistor Tw is turned on to drive the common node electrode NE1 to 0 V. Thereby −0.7 V is applied to the capacitor group (C1 to Cn), but the low value effects practically no state change.

On the other hand, when the bit line BL is at 1 V (that is, the data to be written is "1"), the writing access transistor Tw remains off, and therefore the common node electrode NE1 remains at 1.4 V in a floating state. At this time, 0.7 V is applied to the capacitor group (C1 to Cn), but the low value effects practically no state change.

[Timing W16]

In this timing, only the selected plate line PL1 is driven to 2.1 V. Thereby, when the bit line BL is at 0 V, that is, when "0" is set to be written, −2.1 V is applied to the selected capacitor C1, whereby "0" is written to the selected capacitor C1.

On the other hand, when the bit line BL is at 1 V, −0.7 V is applied to the selected capacitor C1, but the low value effects practically no state change. Thus, "1" written in timing W11 is stored as it is.

[Timing W17]

The selected plate line PL1 is returned to 0.7 V, whereby the writing of "0" is ended.

[Timing W18]

The plate lines (PL1 to PLn) and the bit line BL are all equalized to 0 V. Thereby the voltage applied to all the capacitors is returned to 0 V.

[Timing W19]

The writing word line WLw is turned off, whereby the writing process is completed.

When writing is performed by this procedure, desired data can be written to only the selected capacitor. Since the voltage applied to the nonselected capacitors remains in a range of substantially ±0.7 V, that is, (⅓) Vcc, the nonselected capacitors do not effect inversion, and thus the state of storage of the nonselected capacitors is maintained.

Further, only an amplitude of 1 V is required for the bit line BL, thus greatly reducing power consumption. Further, the writing of "1" and the driving of the bit line BL can be performed in parallel with each other, which is effective in reducing access time.

<Fourth Embodiment>

Figure 14:
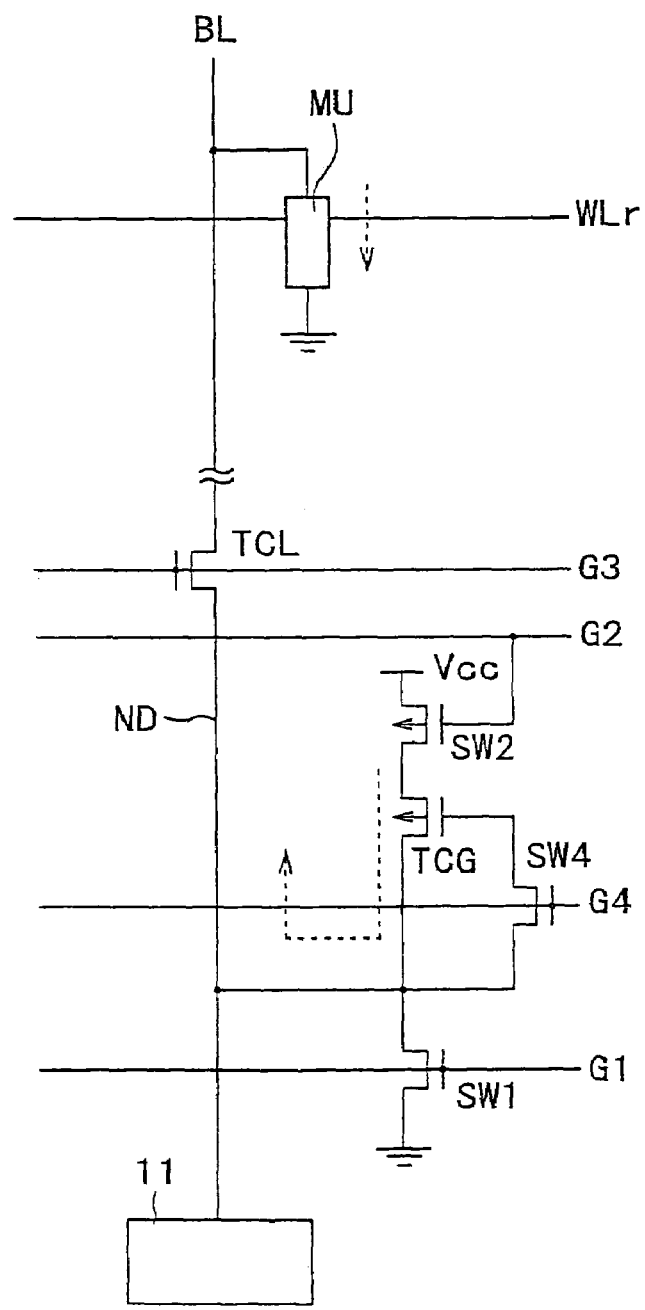
FIG. 14 is a diagram of assistance in explaining a configuration of a control circuit of a fourth embodiment of the present invention.
Figure 16:
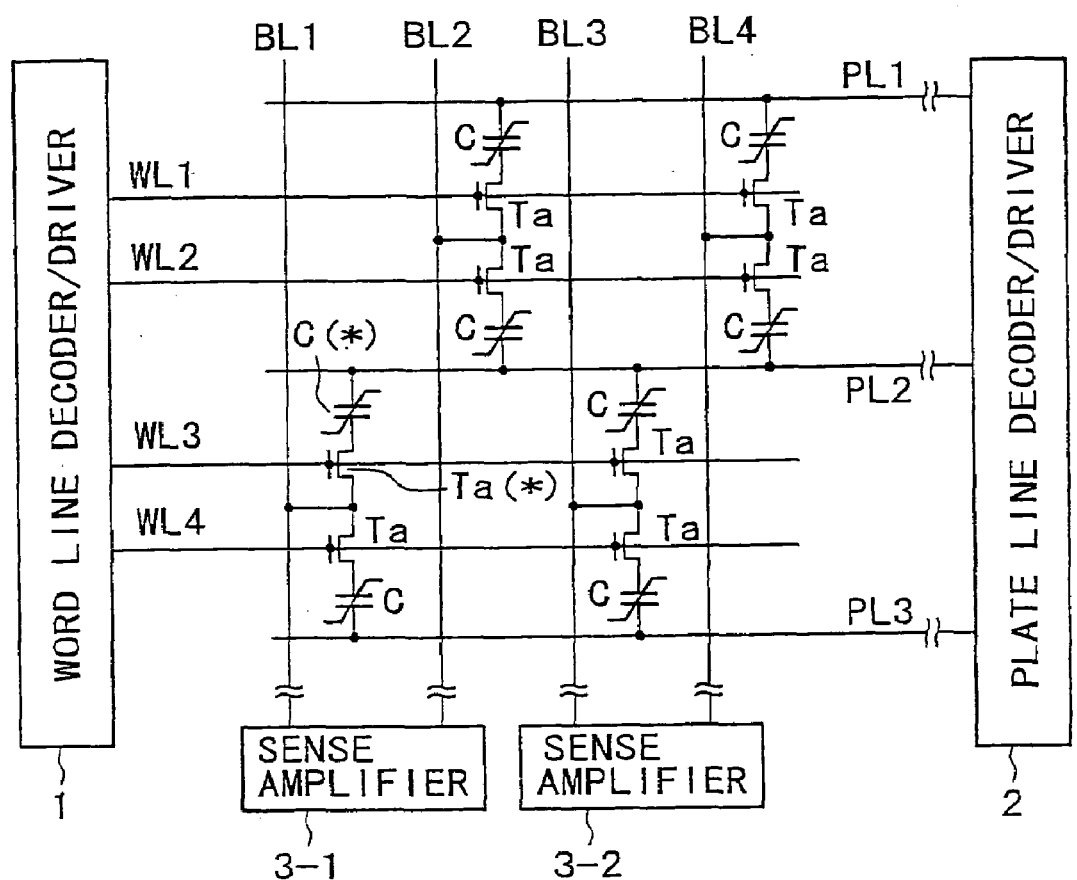
FIG. 16 is a diagram of assistance in explaining a configuration of a semiconductor memory formed by ferroelectric capacitors.
Figure 17:
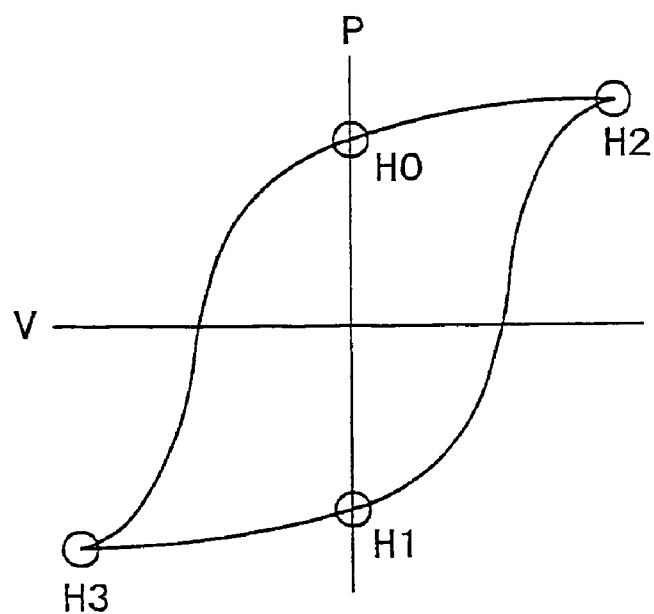
FIG. 17 is a diagram of assistance in explaining behavior of a ferroelectric capacitor.
Figure 18:
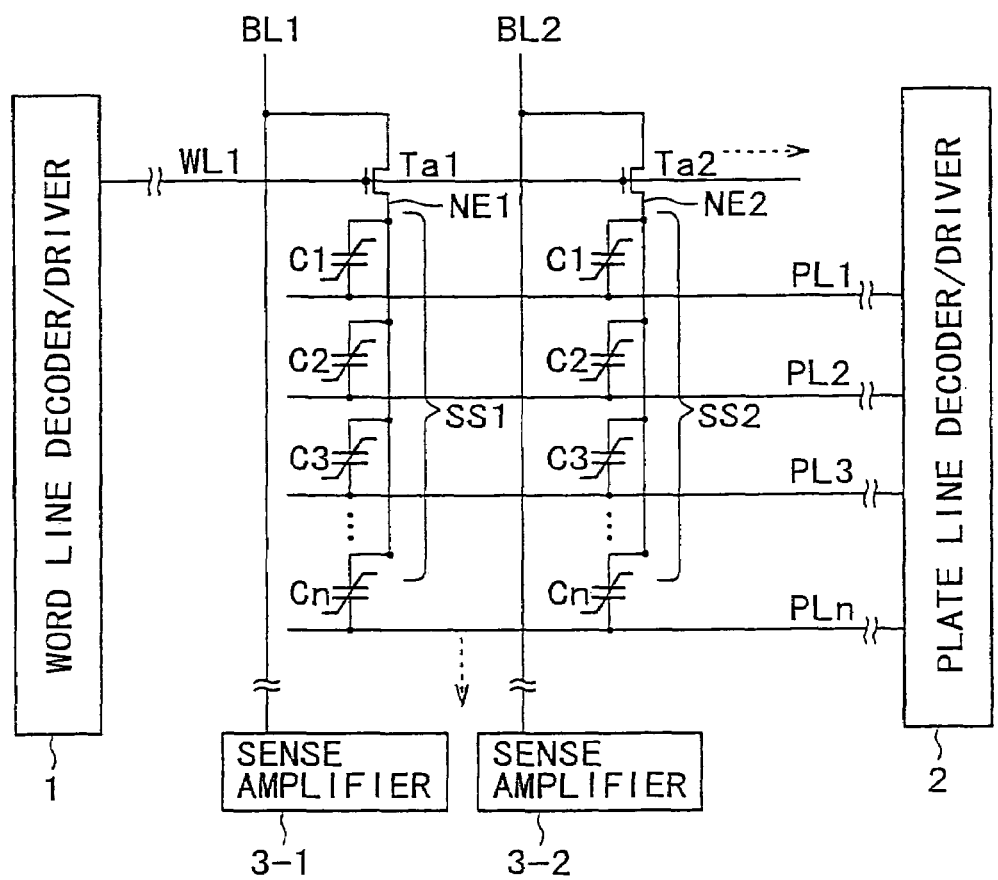
FIG. 18 is a diagram of assistance in explaining a cross point type ferroelectric memory.
Figure 19:
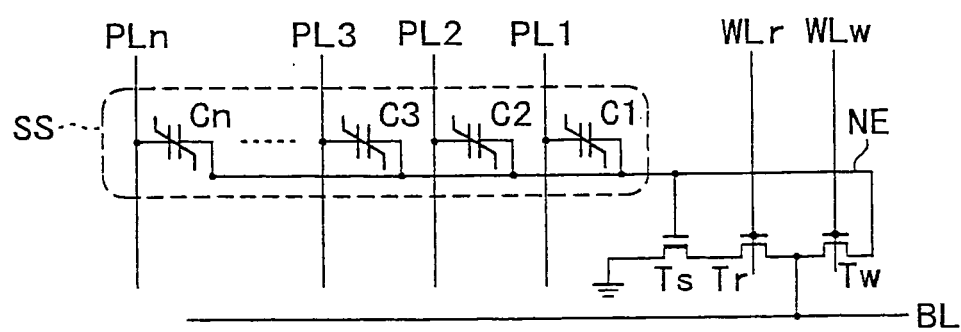
FIG. 19 is a diagram of assistance in explaining an amplification type cross point type ferroelectric memory.
Figure 20A:
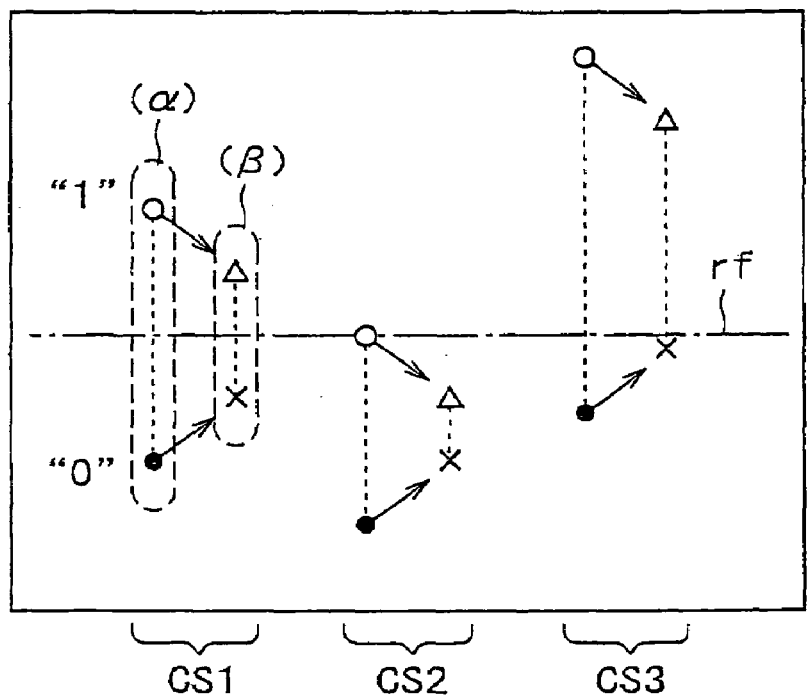
FIGS. 20A and 20B are diagrams of assistance in explaining signal variations of ferroelectric capacitors, FIG. 20A representing an example of giving a uniform reference signal rf, and FIG. 20B representing an example in which signals obtained by adding a fixed offset OF to a signal at a low level (corresponding to "0" in this case) of each memory cell provide reference signals rf1, rf2, and rf3.
Figure 20B:
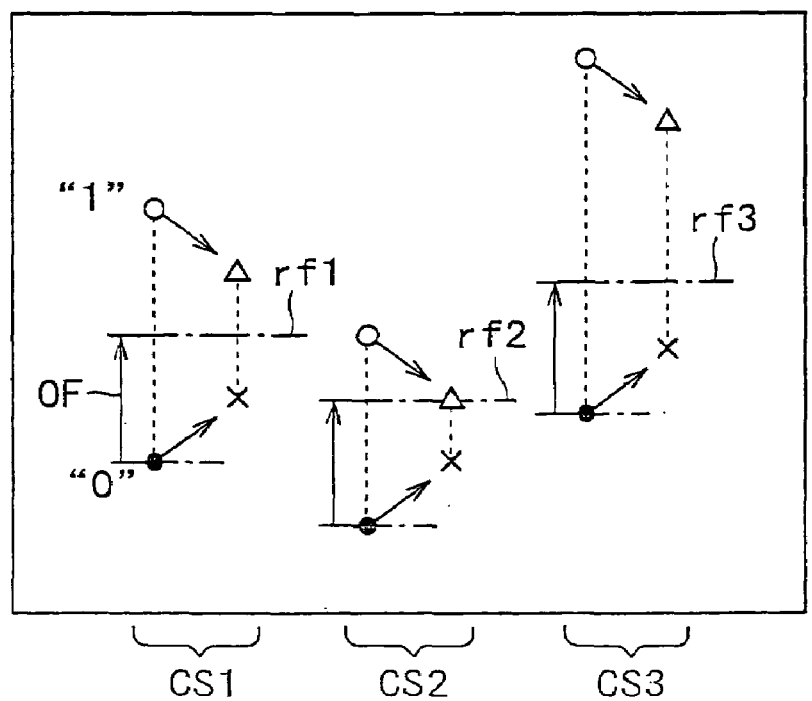

A fourth embodiment determines a current signal by a first and a second current reading as in the foregoing third embodiment more simply and with a smaller circuit scale. FIG. 14 shows an example of a determining circuit of the fourth embodiment.

This circuit is formed by inserting a switch transistor SW4 between the gate of the charging transistor TCG and the input node ND of the circuit in FIG. 11. A circuit shown as a comparing and determining circuit 11 in this case does not need to have a special comparing and determining function in practice; the circuit may be simply a latch or formed by directly connecting a data bus.

Operation in this case is different from the example of operation of the foregoing third embodiment in that the switch transistor SW4 is turned off after a first bit line charge and reading, and a second bit line charge and reading is performed in a state in which a gate potential of a transistor TCG is maintained.

FIGS. 15A and 15B are conceptual diagrams of the operation.

The first bit line charge and reading is performed in a conducting state of the switch transistor SW4, as shown in FIG. 15A. When a potential of an input node ND is determined corresponding to a current read from a memory unit MU, the switch transistor SW4 is turned off to maintain the gate potential of the charging transistor TCG. At this time, the current of the memory unit MU and a supply current of the charging transistor TCG are in equilibrium with each other, and are both i1.

The second bit line charge and reading is performed while the switch transistor SW4 remains turned off, as shown in FIG. 15B. At this time, since the first signal potential is stored in the gate of the charging transistor TCG, the same charge current i1 as in the first bit line charge and reading flows through the transistor TCG. On the other hand, a second read current i2 flows in the memory unit MU in correspondence with data stored in the memory unit MU.

The input node ND accumulates a charge corresponding to a difference between the charge current i1 and the unit current i2 in the second reading, that is, a difference (i1−i2) between the first unit current and the second unit current. When i2 is a reference current, for example, the potential of the input node ND is raised to close to Vcc when i1 is at a high level, while the potential of the input node ND is lowered to close to 0 V when i1 is at a low level. Thus, automatic amplification and determination is performed.

It is to be noted that while this circuit is of course suitable for the self-reference determination system according to the present invention, the circuit is also applicable to self-reference determination of other memories such as MRAM, which stores data by direction of magnetization of magnetic film, OUM, which stores data by crystal state of chalcogenide film, and the like. Further, the applications of the circuit are not limited to self-reference; the circuit is usable in any semiconductor memory application in which currents at a first access and a second access are compared with each other for determination on an identical bit line. For example, the circuit is effective in a case where a dummy cell is provided on an identical bit line, and a first result obtained by accessing a selected cell and a second result obtained by accessing the dummy cell are compared with each other.

While the first to fourth embodiments of the present invention have been described above, the present invention is not limited to the configurations and operations of the embodiments. For example, while the third embodiment is an example based on a configuration referred to as an amplification type cross point memory, it is needless to say that the present invention is applicable to non-amplification type cross point memories.

What is claimed is:

1. A data writing method in a semiconductor memory device, said semiconductor memory device including: a memory cell connected to a bit line via a first switching element and storing data by state of polarization of a ferroelectric capacitor; and a second switching element disposed between said memory cell and a constant-voltage node, said data writing method comprising:
   a first writing step for writing high-level data to said memory cell without using said bit line by making said second switching element conduct; and
   a second writing step for applying a high-level or low-level signal to said bit line and making said first switching element conduct.

2. A data writing method in a semiconductor memory device, said semiconductor memory device including: a plurality of memory cells storing data by state of polarization of a ferroelectric capacitor, and having a cell string configuration in which one terminal of each of the memory cells is connected to a common node electrode connected to a bit line via a first switching element; and a second switching element disposed between said common node electrode and a constant-voltage node, said data writing method comprising:
   a first writing step for writing high-level data to a memory cell selected in said cell string configuration without using said bit line by making said second switching element conduct; and
   a second writing step for applying a high-level or low-level signal to said bit line and making said first switching element conduct.

3. A semiconductor memory device comprising: a memory cell storing data by state of polarization of a ferroelectric capacitor, connected to a bit line via a first switching element, and connected to a constant-voltage node via a second switching element;
   first writing means for writing high-level data to said memory cell without using said bit line by making said second switching element conduct; and
   second writing means for writing low-level data to said memory cell by applying a low-level signal to said bit line and making said first switching element conduct.

4. A semiconductor memory device comprising: a memory unit having a cell string configuration in which one terminal of each of a plurality of memory cells storing data by state of polarization of a ferroelectric capacitor is connected to a common node electrode connected to a bit line via a first switching element and connected to a constant-voltage node via a second switching element;
   first writing means for writing high-level data to a memory cell selected in said cell string configuration without using said bit line by making said second switching element conduct; and
   second writing means for writing low-level data to said selected memory cell by applying a low-level signal to said bit line and making said first switching element conduct.

* * * * *